US011171417B2

(12) United States Patent
Ma et al.

(10) Patent No.: US 11,171,417 B2
(45) Date of Patent: Nov. 9, 2021

(54) METHOD AND APPARATUS FOR CALIBRATING ANTENNA

(71) Applicant: DATANG MOBILE COMMUNICATIONS EQUIPMENT CO., LTD., Beijing (CN)

(72) Inventors: Jingyan Ma, Beijing (CN); Shihua Wang, Beijing (CN); Tao Duan, Beijing (CN); Jian Wu, Beijing (CN); Jieli Wang, Beijing (CN)

(73) Assignee: Datang Mobile Communications Equipment Co., Ltd., Beijing (CN)

( * ) Notice: Subject to any disclaimer, the term of this patent is extended or adjusted under 35 U.S.C. 154(b) by 0 days.

(21) Appl. No.: 17/265,360

(22) PCT Filed: Jul. 24, 2019

(86) PCT No.: PCT/CN2019/097551
§ 371 (c)(1),
(2) Date: Feb. 2, 2021

(87) PCT Pub. No.: WO2020/024861
PCT Pub. Date: Feb. 6, 2020

(65) Prior Publication Data
US 2021/0257730 A1 Aug. 19, 2021

(30) Foreign Application Priority Data
Aug. 2, 2018 (CN) .......................... 201810872421.1

(51) Int. Cl.
*H01Q 3/26* (2006.01)
*H04B 17/12* (2015.01)
(Continued)

(52) U.S. Cl.
CPC ............. *H01Q 3/267* (2013.01); *G01R 29/10* (2013.01); *H04B 7/0617* (2013.01);
(Continued)

(58) Field of Classification Search
CPC ... G01S 7/40; G06F 17/10; H01P 5/18; H01Q 3/22; H01Q 3/267; H01Q 9/0457; H04B 17/21; H04B 7/043; H04B 2027/0026
(Continued)

(56) References Cited

U.S. PATENT DOCUMENTS 9,967,081 B2   5/2018 Yang et al.
2001/0016505 A1   8/2001 Rexberg et al.
(Continued)

FOREIGN PATENT DOCUMENTS

CN   103188009 A   7/2013
CN   106324573 A   1/2017
(Continued)

OTHER PUBLICATIONS

International Search Report for International Application No. PCT/CN2019/097551 dated Oct. 10, 2019.
(Continued)

*Primary Examiner* — Tan H Trinh
(74) *Attorney, Agent, or Firm* — Meunier Carlin & Curfman LLC

(57) ABSTRACT

Disclosed in the present application are a method and an apparatus for calibrating an antenna. In the method, in a receiving channel calibration process, first a receiving channel beam weight matrix is initially updated by using a receiving calibration signal from a reference beam direction, i.e., performing initial receiving channel calibration, and then, for different beam direction regions, beam weight vectors corresponding to multiple beam directions within particular beam direction regions are updated.

18 Claims, 7 Drawing Sheets

(51) Int. Cl.

| | | |
|---|---|---|
| *H01Q 3/38* | (2006.01) | |
| *H04B 17/19* | (2015.01) | |
| *H01Q 1/24* | (2006.01) | |
| *H01Q 21/22* | (2006.01) | |
| *H04B 17/21* | (2015.01) | |
| *G01R 29/10* | (2006.01) | |
| *H04B 7/06* | (2006.01) | |
| *H04B 7/08* | (2006.01) | |

(52) U.S. Cl.
CPC .......... *H04B 7/0882* (2013.01); *H04B 17/12* (2015.01); *H04B 17/21* (2015.01)

(58) Field of Classification Search
USPC .................. 455/67.11, 67.16, 63.4, 101
See application file for complete search history.

(56) References Cited

U.S. PATENT DOCUMENTS

| | | | |
|---|---|---|---|
| 2004/0127174 A1* | 7/2004 | Frank | H01Q 3/40 455/101 |
| 2016/0191176 A1* | 6/2016 | O'Keeffe | H04B 17/11 455/63.4 |
| 2017/0048009 A1 | 2/2017 | Sarkar | |
| 2017/0324161 A1* | 11/2017 | Kareisto | H04B 17/21 |
| 2018/0062260 A1* | 3/2018 | Khalil | H04B 5/0043 |
| 2018/0191418 A1 | 7/2018 | Xia et al. | |
| 2019/0267707 A1* | 8/2019 | Khalil | H01Q 21/22 |
| 2020/0067674 A1* | 2/2020 | Guan | H04L 5/00 |
| 2021/0109145 A1* | 4/2021 | Haustein | G01R 29/0871 |

FOREIGN PATENT DOCUMENTS

| | | |
|---|---|---|
| CN | 106371055 A | 2/2017 |
| CN | 107809273 A | 3/2018 |
| CN | 108155958 A | 6/2018 |
| CN | 109495189 A | 3/2019 |
| JP | 2012142964 A | 7/2012 |
| WO | 2016163375 A1 | 10/2016 |
| WO | 2019047831 A1 | 3/2019 |

OTHER PUBLICATIONS

Li et al., Fast Field Array Manifold Calibration for GNSS Antenna Arrays. Telecommunication Engineering, 2018, 58 (5):519-524.

Xu Zhaohui et al., Hierarchical calibration algorithm using isolated large targets on an HFGW radar antenna array, J Tsinghua Univ (Sci & Technol), 2017, vol. 57, No. 1, pp. 7-11.

* cited by examiner

METHOD AND APPARATUS FOR CALIBRATING ANTENNA

CROSS REFERENCE TO RELATED APPLICATIONS

This application is a US National Stage of International Application No. PCT/CN2019/097551, filed on Jul. 24, 2019, which claims priority to China Patent Application No. 201810872421.1, filed on Aug. 2, 2018 in China Patent Office and entitled "Method and Apparatus for Calibrating Antenna", which is hereby incorporated by reference in its entirety.

FIELD

The present disclosure relates to the technical field of wireless communications, and more particularly relates to a method and an apparatus for calibrating an antenna.

BACKGROUND

A large-scale active antenna array technology is a key enabling technology for 5G communications, which ensures the consistency of the amplitudes and phases of respective active channels and is a prerequisite for the effective realization of an array beamforming function.

In the 5G communication era, the large-scale active antenna array technology has become a key enabling technology. For the amplitude and phase calibration and beamforming function verification of an existing large-scale active antenna array system, calibration often needs to be performed under a closed anechoic chamber environment, and a single-tone signal (a signal with a single frequency) is generally used to complete a calibration test. Under an application background that a 5G communication system covers a larger bandwidth, large-scale active antenna arrays need to switch test frequency points in a dark room for calibration testing, which is costly and is not suitable for production and factory calibration. For the production and manufacturing process, there is no better solution for how to carry out rapid calibration test of the system.

Existing testing for calibration and beamforming functions and other functions of a large-scale active antenna array system can only be carried out in a closed anechoic chamber. The test is costly and high in calibration cost. Generally, this is only suitable for laboratory tests in research and development procedures, and cannot be applied to a manufacturing environment of productized production. In addition, an existing over-the-air technology (OTA) calibration test solution is generally single-frequency-point calibration test, which is low in test efficiency, and due to the multiplexing of antenna transmission and reception, the OTA calibration generally also performs the same compensation for transmission and reception, without considering that amplitude and phase differences on transmission and reception channel analog links will produce certain errors and affect the beamforming performance.

SUMMARY

The embodiments of the present disclosure provide a method and an apparatus for calibrating an antenna.

In a first aspect, a method for calibrating an antenna is provided. A received beam direction range corresponding to a reception channel beam weight matrix of an active antenna array is divided into a plurality of beam direction regions; and one beam direction region corresponds to at least one received beam direction, and at least one beam direction region corresponds to a plurality of received beam directions. The method includes:

receiving, by the active antenna array, a reception calibration signal from a reference beam direction, obtaining an initial amplitude and phase error vector of N reception channels of the active antenna array in the reference beam direction, updating, according to the initial amplitude and phase error vector, a beam weight vector in each beam direction in the reception channel beam weight matrix, and performing, according to the updated beam weight vector in the reference beam direction in the reception channel beam weight matrix, beamforming on the reception calibration signal in the reference beam direction to obtain a first reception channel beam gain corresponding to the reference beam direction, where a beam weight vector of one received beam direction includes beam weights of the N reception channels corresponding to the one received beam direction, and N is an integer greater than 1;

receiving, by the active antenna array, a reception calibration signal from a first beam direction region, and performing beamforming on the reception calibration signal in the first beam direction region by using a beam weight vector of a corresponding direction angle in the reception channel beam weight matrix according to a direction angle corresponding to the first beam direction region, to obtain a second reception channel beam gain corresponding to the first beam direction region; and if a gain error between the second reception channel beam gain and the first reception channel beam gain is greater than a gain error threshold, performing at most K reception channel calibration iteration processes according to the reception calibration signal from the first beam direction region, where K is the maximum number of iterations, and the first beam direction region is one of the plurality of beam direction regions.

In one possible implementation mode, in each iteration process in the at most K reception channel calibration iteration processes, the active antenna array executes:

obtaining an amplitude and phase error vector of the N reception channels of the active antenna array in the first beam direction region according to the reception calibration signal from the first beam direction region;

updating the beam weight vector in the beam direction in the first beam direction region in the reception channel beam weight matrix according to the amplitude and phase error vector determined in a current iteration process;

performing beamforming on the reception calibration signal from the first beam direction region by using the updated beam weight vector in the corresponding direction angle in the reception channel beam weight matrix according to the direction angle of the reception calibration signal from the first beam direction region, to obtain a reception channel beam gain corresponding to the first beam direction region; and determining whether a gain error between the reception channel beam gain determined in the current iteration process and the first reception channel beam gain is greater than the gain error threshold; if the gain error is greater than the gain error threshold, receiving the reception calibration signal from the first beam direction region in the case of not reaching the maximum number of iterations, and performing a next iteration process; otherwise, ending the current iteration process.

In one possible implementation mode, both an azimuth angle and a pitching angle of the reference beam direction are zero.

In one possible implementation mode, the direction angle of the reference beam direction is different from an azimuth angle of any beam direction region.

In a second aspect, a method for calibrating an antenna is provided. A transmitted beam direction range corresponding to a transmission channel beam weight matrix of an active antenna array is divided into a plurality of beam direction regions; and one beam direction region corresponds to at least one transmitted beam direction, and at least one beam direction region corresponds to a plurality of transmitted beam directions. The method includes:

transmitting, by the active antenna array, a transmission calibration signal by using a beam weight vector in a reference beam direction in a transmission channel beam weight matrix; obtaining, according to a reception sequence of the transmission calibration signal, an initial amplitude and phase error vector of N transmission channels of the active antenna array; updating, according to the initial amplitude and phase error vector, the transmission calibration signal and a beam weight vector in each beam direction in the transmission channel beam weight matrix; transmitting the updated transmission calibration signal by using the updated beam weight vector of the reference beam direction in the transmission channel beam weight matrix; and performing, according to the beam weight vector in the reference beam direction, beamforming on the reception sequence of the updated transmission calibration signal to obtain a first transmission channel beam gain corresponding to the reference beam direction; where a beam weight vector of one transmitted beam direction includes beam weights of the N transmission channels corresponding to the one transmitted beam direction, and N is an integer greater than 1;

transmitting, by the active antenna array, a transmission calibration signal by using a beam weight vector corresponding to a direction angle of a first beam direction region, and performing beamforming on a reception sequence of the transmitted transmission calibration signal by using the beam weight vector of the corresponding direction angle in the transmission channel beam weight matrix, to obtain a second transmission channel beam gain corresponding to the first beam direction region; and if a gain error between the second transmission channel beam gain and the first transmission channel beam gain is greater than a gain error threshold, performing at most K transmission channel calibration iteration processes, where K is the maximum number of iterations, and the first beam direction region is one of the plurality of beam direction regions.

In one possible implementation mode, in each iteration process in the at most K transmission channel calibration iteration processes, the active antenna array executes:

obtaining, according to the reception sequence of the transmission calibration signal transmitted by using the beam weight vector corresponding to the direction angle of the first beam direction region, an amplitude and phase error vector of the N transmission channels of the active antenna array in the first beam direction region;

updating the transmission calibration signal and the beam weight vector of the beam direction in the first beam direction region in the transmission channel weight matrix according to the amplitude and phase error vector determined in a current iteration process;

transmitting the updated transmission calibration signal by using the beam weight vector corresponding to the direction angle in the first beam direction region;

performing beamforming on the reception sequence of the transmission calibration signal by using the beam weight vector corresponding to the direction angle, to obtain a transmission channel beam gain corresponding to the first beam direction region;

determining whether a gain error between the transmission channel beam gain determined in the current iteration process and the first transmission channel beam gain is greater than the gain error threshold; if the gain error is greater than the gain error threshold, transmitting the transmission calibration signal by using the beam weight vector of the direction angle corresponding to the first beam direction region in the case of not reaching the maximum number of iterations, and performing a next iteration process; otherwise, ending the current iteration process.

In one possible implementation mode, both an azimuth angle and a pitching angle of the reference beam direction are zero.

In one possible implementation mode, the direction angle of the reference beam direction is different from an azimuth angle of any beam direction region.

In a third aspect, an apparatus for calibrating an antenna is provided, which is applied to an active antenna array. A received beam direction range corresponding to a reception channel beam weight matrix of the active antenna array is divided into a plurality of beam direction regions; one beam direction region corresponds to at least one received beam direction, and at least one beam direction region corresponds to a plurality of received beam directions. The apparatus includes:

an initial calibration module, configured to obtain, according to a reception calibration signal received by the active antenna array from a reference beam direction, an initial amplitude and phase error vector of N reception channels of the active antenna array in the reference beam direction; update, according to the initial amplitude and phase error vector, a beam weight vector in each beam direction in the reception channel beam weight matrix; and perform, according to the updated beam weight vector in the reference beam direction in the reception channel beam weight matrix, beamforming on the reception calibration signal in the reference beam direction to obtain a first reception channel beam gain corresponding to the reference beam direction, where a beam weight vector of one received beam direction includes beam weights of the N reception channels corresponding to the one received beam direction, and N is an integer greater than 1; and a regional calibration module, configured to perform beamforming on a reception calibration signal in a first beam direction region by using a beam weight vector in a corresponding direction angle in the reception channel beam weight matrix according to the reception calibration signal received by the active antenna array from the first beam direction region and a direction angle corresponding to the first beam direction region, to obtain a second reception channel beam gain corresponding to the first beam direction region; and if a gain error between the second reception channel beam gain and the first reception channel beam gain is greater than a gain error threshold, perform at most K reception channel calibration iteration processes according to the reception calibration signal from the first beam direction region, where K is the maximum number of iterations, and the first beam direction region is one of the plurality of beam direction regions.

In one possible implementation mode, in each iteration process in the at most K reception channel calibration iteration processes, the regional calibration module executes:

obtaining, according to the reception calibration signal from the first beam direction region, an amplitude and phase error vector of the N reception channels of the active antenna array in the first beam direction region;

updating the beam weight vector in the beam direction in the first beam direction region in the reception channel beam weight matrix according to the amplitude and phase error vector determined in a current iteration process:

performing beamforming on the reception calibration signal from the first beam direction region by using the updated beam weight vector in the corresponding direction angle in the reception channel beam weight matrix according to the direction angle of the reception calibration signal from the first beam direction region, to obtain a reception channel beam gain corresponding to the first beam direction region; and determining whether a gain error between the reception channel beam gain determined in the current iteration process and the first reception channel beam gain is greater than the gain error threshold; if the gain error is greater than the gain error threshold, receiving the reception calibration signal from the first beam direction region in the case of not reaching the maximum number of iterations, and performing a next iteration process; otherwise, ending the current iteration process.

In one possible implementation mode, both an azimuth angle and a pitching angle of the reference beam direction are zero.

In one possible implementation mode, the direction angle of the reference beam direction is different from an azimuth angle corresponding to any beam direction region.

In a fourth aspect, an apparatus for calibrating an antenna is provided, which is applied to an active antenna array. A transmitted beam direction range corresponding to a transmission channel beam weight matrix of the active antenna array is divided into a plurality of beam direction regions; and one beam direction region corresponds to at least one transmitted beam direction, and at least one beam direction region corresponds to a plurality of transmitted beam directions. The apparatus includes:

an initial calibration module, configured to: obtain an initial amplitude and phase error vector of N transmission channels of the active antenna array according to a reception sequence of a transmission calibration signal transmitted by the active antenna array by using a beam weight vector in a reference beam direction in the transmission channel beam weight matrix, update, according to the initial amplitude and phase error vector, the transmission calibration signal and the beam weight vector in each beam direction in the transmission channel beam weight matrix, transmit the updated transmission calibration signal by using the updated beam weight vector of the reference beam direction in the transmission channel beam weight matrix, and perform, according to the beam weight vector in the reference beam direction, beamforming on the reception sequence of the updated transmission calibration signal to obtain a first transmission channel beam gain corresponding to the reference beam direction, where a beam weight vector of one transmitted beam direction includes beam weights of the N transmission channels corresponding to the one transmitted beam direction, and N is an integer greater than 1;

a regional calibration module, configured to: after the active antenna array transmits a transmission calibration signal by using a beam weight vector corresponding to a direction angle of a first beam direction region, perform beamforming on a reception sequence of the transmitted transmission calibration signal by using the beam weight vector of the corresponding direction angle in the transmission channel beam weight matrix to obtain a second transmission channel beam gain corresponding to the first beam direction region; and if a gain error between the second transmission channel beam gain and the first transmission channel beam gain is greater than a gain error threshold, perform at most K transmission channel calibration iteration processes, where K is the maximum number of iterations, and the first beam direction region is one of the plurality of beam direction regions.

In one possible implementation mode, in each iteration process in the at most K transmission channel calibration iteration processes, the regional calibration module executes:

obtaining, according to the reception sequence of the transmission calibration signal transmitted by using the beam weight vector corresponding to the direction angle of the first beam direction region, an amplitude and phase error vector of the N transmission channels of the active antenna array in the first beam direction region;

updating the transmission calibration signal and the beam weight vector of the beam direction in the first beam direction region in the transmission channel weight matrix according to the amplitude and phase error vector determined in a current iteration process;

transmitting the updated transmission calibration signal by using the beam weight vector corresponding to the direction angle in the first beam direction region;

performing beamforming on the reception sequence of the transmission calibration signal by using the beam weight vector corresponding to the direction angle, to obtain a transmission channel beam gain corresponding to the first beam direction region; and determining whether a gain error between the transmission channel beam gain determined in the current iteration process and the first transmission channel beam gain is greater than the gain error threshold; if the gain error is greater than the gain error threshold, transmitting the transmission calibration signal by using the beam weight vector of the direction angle corresponding to the first beam direction region in the case of not reaching the maximum number of iterations, and performing a next iteration process; otherwise, ending the current iteration process.

In one possible implementation mode, both an azimuth angle and a pitching angle of the reference beam direction are zero.

In one possible implementation mode, the direction angle of the reference beam direction is different from an azimuth angle corresponding to any beam direction region.

In a fifth aspect, a communication apparatus is provided, including: a processor, a memory and a transceiver. The transceiver includes a transmission channel and a reception channel. A received beam direction range corresponding to a reception channel beam weight matrix is divided into a plurality of beam direction regions; and one beam direction region corresponds to at least one received beam direction, and at least one beam direction region corresponds to a plurality of received beam directions:

the processor is configured to read a program in the memory and execute:

obtaining, according to a reception calibration signal received by an active antenna array from a reference beam direction, an initial amplitude and phase error vector of N reception channels of the active antenna array in the reference beam direction, updating, according to the initial amplitude and phase error vector, a beam weight vector in each beam direction in the reception channel beam weight matrix, and performing, according to the updated beam weight vector in the reference beam direction in the reception channel beam weight matrix, beamforming on the reception calibration signal in the reference beam direction to obtain a first reception channel beam gain corresponding to the reference beam direction, where a beam weight vector of one received beam direction includes beam weights of the N reception channels corresponding to the one received beam direction, and N is an integer greater than 1;

performing beamforming on a reception calibration signal in a first beam direction region by using a beam weight vector in a corresponding direction angle in the reception channel beam weight matrix according to the reception calibration signal received by the active antenna array from the first beam direction region and a direction angle corresponding to the first beam direction region, to obtain a second reception channel beam gain corresponding to the first beam direction region; and if a gain error between the second reception channel beam gain and the first reception channel beam gain is greater than a gain error threshold, performing at most K reception channel calibration iteration processes according to the reception calibration signal from the first beam direction region, where K is the maximum number of iterations, and the first beam direction region is one of the plurality of beam direction regions.

In one possible implementation mode, in each iteration process in the at most K reception channel calibration iteration processes, the processor executes:

obtaining, according to the reception calibration signal from the first beam direction region, an amplitude and phase error vector of the N reception channels of the active antenna array in the first beam direction region:

updating the beam weight vector in the beam direction in the first beam direction region in the reception channel beam weight matrix according to the amplitude and phase error vector determined in a current iteration process:

performing beamforming on the reception calibration signal from the first beam direction region by using the updated beam weight vector in the corresponding direction angle in the reception channel beam weight matrix according to the direction angle of the reception calibration signal from the first beam direction region, to obtain a reception channel beam gain corresponding to the first beam direction region;

determining whether a gain error between the reception channel beam gain determined in the current iteration process and the first reception channel beam gain is greater than the gain error threshold; if the gain error is greater than the gain error threshold, receiving the reception calibration signal from the first beam direction region in the case of not reaching the maximum number of iterations, and performing a next iteration process; otherwise, ending the current iteration process.

In one possible implementation mode, both an azimuth angle and a pitching angle of the reference beam direction are zero.

In one possible implementation mode, the direction angle of the reference beam direction is different from an azimuth angle of any beam direction region.

In a sixth aspect, a communication apparatus, including: a processor, a memory and a transceiver. The transceiver includes a transmission channel and a reception channel. A transmitted beam direction range corresponding to a transmission channel beam weight matrix is divided into a plurality of beam direction regions; and one beam direction region corresponds to at least one transmitted beam direction, and at least one beam direction region corresponds to a plurality of transmitted beam directions;

the processor is configured to read a program in the memory and execute:

obtaining an initial amplitude and phase error vector of N transmission channels of the active antenna array according to a reception sequence of a transmission calibration signal transmitted by the active antenna array by using a beam weight vector in a reference beam direction in the transmission channel beam weight matrix, updating, according to the initial amplitude and phase error vector, the transmission calibration signal and the beam weight vector of each beam direction in the transmission channel beam weight matrix, transmitting the updated transmission calibration signal by using the updated beam weight vector of the reference beam direction in the transmission channel beam weight matrix, and performing, according to the beam weight vector in the reference beam direction, beamforming on the reception sequence of the updated transmission calibration signal to obtain a first transmission channel beam gain corresponding to the reference beam direction, where a beam weight vector of one transmitted beam direction includes beam weights of the N transmission channels corresponding to the one transmitted beam direction, and N is an integer greater than 1;

after the transceiver transmits a transmission calibration signal by using a beam weight vector corresponding to a direction angle of a first beam direction region, performing beamforming on a reception sequence of the transmitted transmission calibration signal by using the beam weight vector of the corresponding direction angle in the transmission channel beam weight matrix, to obtain a second transmission channel beam gain corresponding to the first beam direction region; and if a gain error between the second transmission channel beam gain and the first transmission channel beam gain is greater than a gain error threshold, performing at most K transmission channel calibration iteration processes, where K is the maximum number of iterations, and the first beam direction region is one of the plurality of beam direction regions.

In one possible implementation mode, in each iteration process in the at most K reception channel calibration iteration processes, the processor executes:

obtaining, according to the reception sequence of the transmission calibration signal transmitted by using the beam weight vector corresponding to the direction angle of the first beam direction region, an amplitude and phase error vector of the N reception channels of the active antenna array in the first beam direction region;

updating the transmission calibration signal and the beam weight vector of the beam direction in the first beam direction region in the transmission channel weight matrix according to the amplitude and phase error vector determined in a current iteration process:

transmitting the updated transmission calibration signal by using the beam weight vector corresponding to the direction angle in the first beam direction region;

performing beamforming on the reception sequence of the transmission calibration signal by using the beam weight vector corresponding to the direction angle, to obtain a transmission channel beam gain corresponding to the first beam direction region; and determining whether a gain error between the transmission channel beam gain determined in the current iteration process and the first transmission channel beam gain is greater than the gain error threshold if the gain error is greater than the gain error threshold, transmitting the transmission calibration signal by using the beam weight vector of the direction angle corresponding to the first beam direction region in the case of not reaching the maximum number of iterations, and performing a next iteration process; otherwise, ending the current iteration process.

In one possible implementation mode, both an azimuth angle and a pitching angle of the reference beam direction are zero.

In one possible implementation mode, the direction angle of the reference beam direction is different from an azimuth angle corresponding to any beam direction region.

In a seventh aspect, a computer-readable storage medium is provided. The computer-readable storage medium stores a computer-executable instruction. The computer-executable instruction is configured to cause a computer to implement any method in the first aspect.

In an eighth aspect, a computer-readable storage medium is provided. The computer-readable storage medium stores a computer-executable instruction. The computer-executable instruction is configured to cause a computer to implement any method in the second aspect.

DETAILED DESCRIPTION OF THE EMBODIMENTS

Reception models of an N-channel large-scale active antenna array for bandwidth signals s(t) for an azimuth angle $\varphi$ and a pitching angle $\theta$ can be expressed by the following formulas:

$$x(t) = [x_1(t), x_2(t), \ldots, x_N(t)]^T = \qquad (1)$$
$$a(\theta, \varphi, f)s(t) = F^{-1}\left[\sum_{k=1}^{K} a(\theta, \varphi, f_k)s(f_k)\right] + n(t)$$

-continued
$$s(t) = F^{-1}\left[\sum_{k=1}^{K} s(f_k)\right] \qquad (2)$$

$F^{-}[\ ]$ represents fourier inverse transform; $[\bullet]^T$ represents matrix transposition operation; K represents the number of single-frequency signal components included in a signal; $f_k$ represents the frequency of the kth single-frequency signal component; $s(f_k)$ represents a frequency spectrum of the kth single-frequency signal component; the dimension of $a(\theta, \varphi, f_k)$ is N×1 that represents an amplitude and phase response of the kth single-frequency signal component and used to be called an array guide vector of a signal; and the dimension of n(t) is N×1 that represents a noise vector of an array and is generally supposed to be additive white gaussian noise for the convenience of analysis. For the convenience of expression of the formulas, $a(\theta, \varphi, f_k)$ is recorded to be $a_k(\theta, \varphi)$. When a signal is a narrow-band signal, i.e., when K in the formula (1) is equal to 1, $f_0$ represents a center carrier frequency of the signal, and the formula (1) is transformed into:

$$x(t) = F^{-1}[a_0(\theta, \varphi)s(f_0)] + n(t) = a_0(\theta, \varphi)s(t) + n(t) \qquad (3)$$

The existing beamforming is generally performing, based on a narrow-band model shown by the formula (3), phase adjustment of a corresponding beam position on each channel, that is, a beam weight vector is set to be $w = a_0(\theta, \varphi)$.

Figure 1:
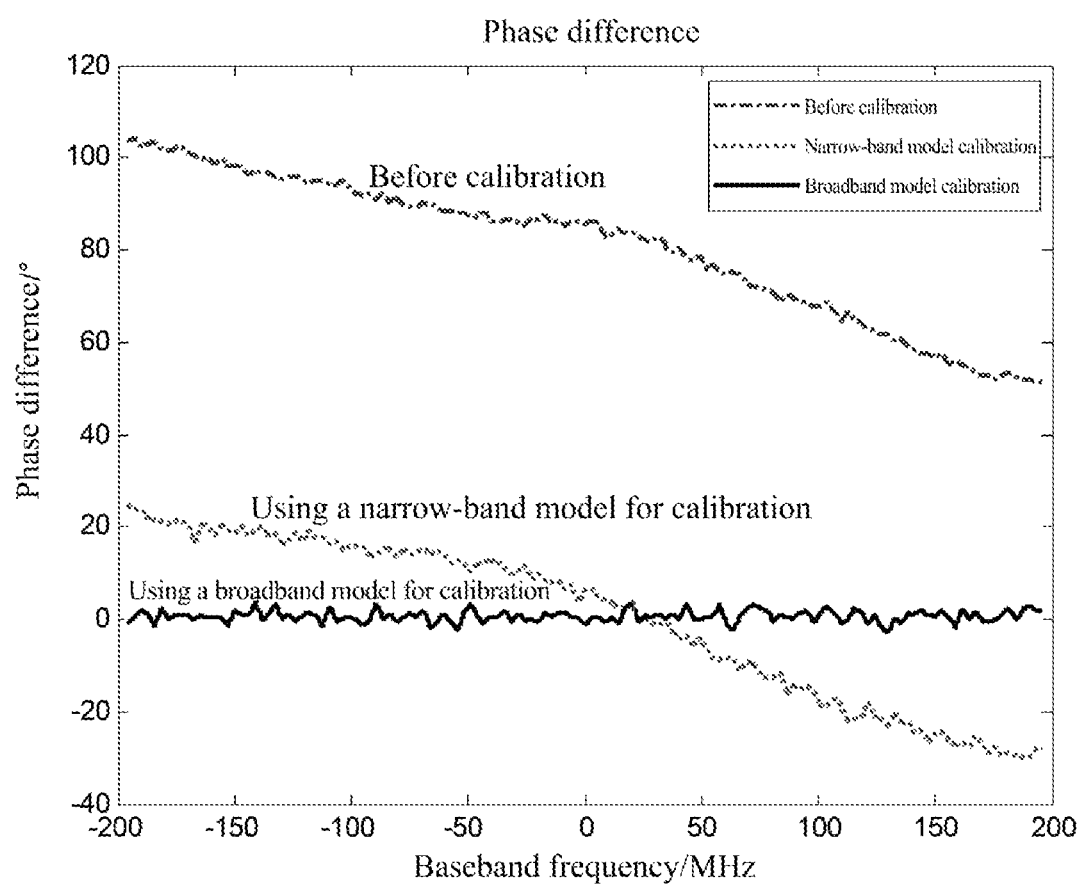
FIG. 1 is a comparative schematic diagram of antenna calibration between the prior art and the embodiment of the present disclosure.

An absolute signal bandwidth used in a 5G communication system is much greater than a signal bandwidth used in a conventional communication system. FIG. 1 illustrates phase difference characteristics of two channels before and after a large-scale antenna array system uses a narrow-band model for calibration under a 400M working bandwidth. It can be seen that only the phase difference at a center frequency point is relatively small, and the phase difference at an edge frequency point of the working bandwidth is relatively large. $[\bullet]^H$ represents a conjugate transpose operation; and the beamforming gain may be expressed by $|w^H a(\theta, \varphi)|/|w^H w|$. Due to $|w^H a_k(\theta, \varphi)| < |w^H a_0(\theta, \varphi)|$, $f_k \neq f_0$, the beamforming gain may be greatly affected.

The embodiments of the present disclosure provide a method for calibrating an antenna which may perform multi-channel broadband calibration for a large-scale active antenna array. The method compensates, based on a test environment of an OTA, an amplitude and phase error of a channel antenna within a relatively large frequency bandwidth range. The full line in FIG. 1 represents a phase difference characteristic of two channels after the calibration method according to the embodiments of the present disclosure is used for calibration. Compared with single-tone calibration, the method according to the embodiments of the present disclosure can keep amplitude and phase differences of channels consistent within the working bandwidth of the whole system, thereby effectively ensuring a beamforming effect of the large-scale antenna array for a large-bandwidth signal and ensuring the effectiveness and integrity of a forming function of a device during production detection.

It can be found from the comparison, shown in FIG. 1, of the phase difference characteristics before and after the calibration that a phase difference between channels is mainly composed of two parts: the first part is that a channel difference causes an initial phase difference of the center frequency point, i.e., a phase difference compensated by a narrow-band calibration model, and the second part is that a frequency bandwidth causes a phase difference varying with phases, and the phase difference can be effectively compensated through a broadband calibration model.

The embodiments of the present disclosure compensate and calibrate the amplitude and phase differences of the channels in two parts. An initial phase difference corresponding to the center frequency point is compensated to an original theoretical beam weight table, and a phase difference caused by a signal frequency bandwidth is calibrated and compensated via amplitude and phase equalization of a single channel.

The embodiments of the present disclosure are described in detail below in combination with the drawings.

In the embodiments of the present disclosure, a calibration environment is built at first based on a production scene of a device, an active antenna array is then calibrated under the built calibration environment.

Optionally, a production environment of the device may be appropriately transformed to make an electromagnetic environment relatively stable and meet a far field test condition, thereby obtaining the calibration environment used in the embodiments of the present disclosure.

Figure 2:
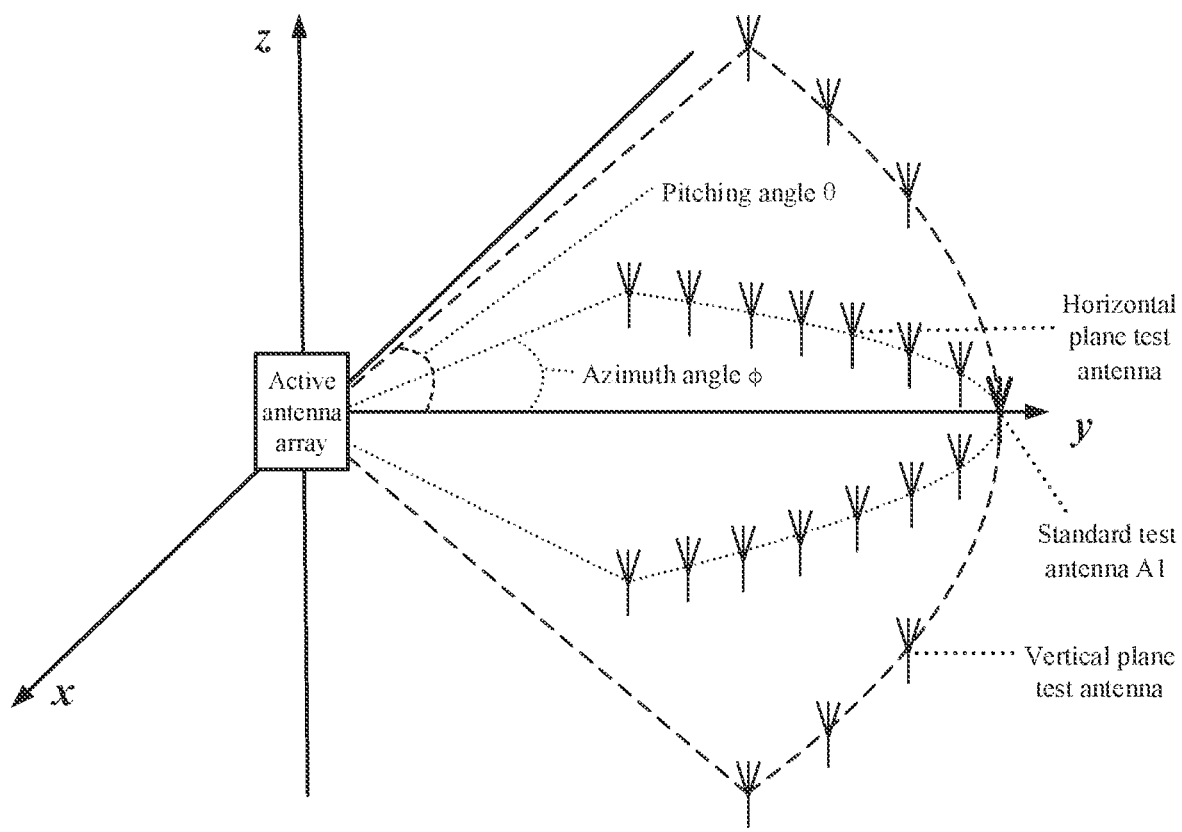
FIG. 2 is a schematic diagram of an antenna calibration environment in the embodiment of the present disclosure.

FIG. 2 exemplarily shows a calibration environment used in the embodiments of the present disclosure. As shown in FIG. 2, the calibration environment includes an active antenna array to be tested, and also includes a test antenna used for calibrating the active antenna array. A distance between the test antenna and the active antenna array meets the far field test condition. The test antenna may also be replaced by a terminal. The embodiments of the present disclosure are described by taking the test antenna as an example.

There may be a plurality of test antennas, and the plurality of test antennas may be placed at different positions on different planes. The test antennas connected by dash-dotted lines in FIG. 2 are placed on a horizontal plane (such as an X-Y plane in the figure), and the test antennas connected by dotted lines are placed on a vertical plane (such as a Y-Z plane in the figure). A direction angle of a test antenna may be expressed by an azimuth angle $\varphi$ on the horizontal plane and a pitching angle $\theta$ on the vertical plane.

A reception channel beam weight matrix W of the active antenna array includes beam weight vectors corresponding to a plurality of received beam directions (i.e., a plurality of direction angles). The beam weight vector of one received beam direction includes beam weights of N reception channels corresponding to the one received beam direction. N is the number of the reception channels of the active antenna array, and N is an integer greater than 1.

Supposing that the reception channel beam weight matrix W includes beam weight vectors corresponding to Q (Q is an integer greater than 1) received beam directions (i.e., Q direction angles), a space range corresponding to the Q received beam directions may be divided into L (L is an integer greater than 1, L<Q) beam direction regions according to the placement positions and the number of the test antennas. Each beam direction region corresponds to at least one beam direction, and at least one beam direction region in the L beam direction regions corresponds to a plurality of received beam directions. The active antenna array may store a correspondence between each beam direction region and the received beam directions.

For example, if a total range of the received beam directions corresponding to the reception channel beam weight matrix W is that: in case of an azimuth angle range $\varphi \in [-35°, 35°]$ of a horizontal direction, a pitching angle range $\theta \in [-15°, 15°]$ of a vertical direction, and the received beam direction taking 0.5° as a step size, the reception channel beam weight matrix W includes 200 received beam directions. As shown in FIG. 2, one test antenna 0 (i.e., a standard test antenna A1 in the figure) placed at the position at the azimuth angle $\varphi_q = 0°$ and the pitching angle $\theta_q = 0°$ is used as a test antenna corresponding to a reference beam direction. Taking 0.5° as a step size, 14 test antennas are placed on the X-Y horizontal plane, and correspond to 14 azimuth angles; and 6 test antennas are placed on the Y-Z vertical plane, and correspond to 6 pitching angles. In this way, the whole direction angle range corresponding to Q=200 received beam directions can be divided into 20 beam direction regions, i.e., L=20. One test antenna corresponds to one beam direction region, and one beam direction region corresponds to one direction angle. The direction angle is the direction angle of the corresponding test antenna. The direction angle of a signal transmitted by the test antenna located in the beam direction region l is $(\theta_l, \varphi_l)$, and this beam direction region corresponds to all received beam directions in the following direction angle range: the azimuth angle range is $$\left[\varphi_l - \frac{P}{2}, \varphi_l + \frac{P}{2}\right],$$

and the pitching angle range is $$\left[\theta_l - \frac{P}{2}, \theta_l + \frac{P}{2}\right]$$

where P is a step size.

For example, the direction angle of the test antenna 1 in FIG. 2 is $(\varphi_1 = 5°, \theta_1 = 0°)$, the azimuth angle range of the corresponding beam region is [2.5°, 7.5°], and the pitching angle range of the corresponding beam region is [−2.5°, 2.5°]. That is, all the received beam directions in the direction angle range correspond to this region.

Before the active antenna array is calibrated, a reception channel initial beam weight matrix may be formed based on active antenna array characteristics. The reception channel initial beam weight matrix may be expressed as.

$$W = [w(\theta_1, \varphi_1), w(\theta_2, \varphi_2), \ldots, w(\theta_Q, \varphi_Q)] \quad (4)$$

Where q is an integer, $1 \leq q \leq Q$; Q represents the number of received beam directions in the reception channel beam weight matrix, and $w(\theta_q, \varphi_q)$ represents a beam weight vector corresponding to the qth received beam direction. For example, $w(\theta_1, \varphi_1)$ represents a beam weight vector corresponding to the received beam direction 1, and $w(\theta_2, \varphi_2)$ represents a beam weight vector corresponding to the beam direction 2, and the rest can be done in the same manner.

The dimension number of the beam weight vector $w(\theta_q, \varphi_q)$ in the reception channel initial beam weight matrix W indicates the number of channels.

Theoretically, there is:

$$w(0°, 0°) = 1_{N \times 1} \quad (5)$$

That is, theoretically, for a terminal (test antenna) having both the azimuth angle and the pitching angle being zero, its beam weight vector is a vector of full 1, and beamforming realizes data addition operation of channels.

Before calibration, the reception channel beam weight matrix of the active antenna array is represented as $w_{RX} = w$. That is, before the calibration, the reception channel beam weight matrix of the active antenna array is set to be the same as the initial beam weight matrix W.

Figure 3:
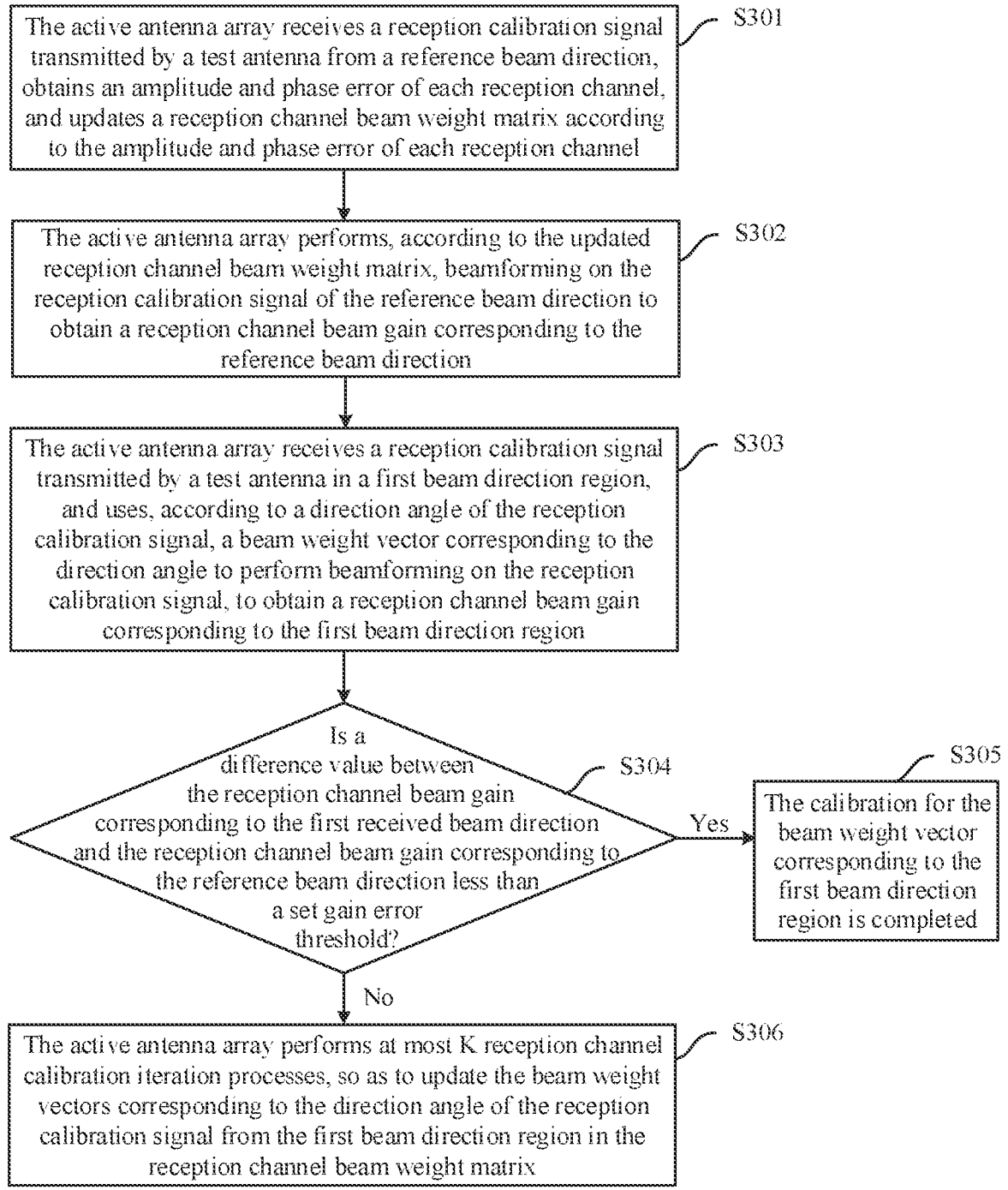
FIG. 3 is a schematic diagram of a reception channel calibration flow according to the embodiment of the present disclosure.

Referring to FIG. 3, it is a schematic diagram of a reception channel calibration flow for an active antenna array according to the embodiment of the present disclosure.

Before the reception channels are calibrated, a sequence of a reception calibration signal may be generated at first. The reception calibration signal is transmitted by a test antenna to the active antenna array for calibrating the reception channels of the active antenna array.

During specific implementation, a frequency domain sequence $S_{RX}(k)$, k=1, 2, . . . K of the reception calibration signal and a time domain sequence $s_{RX}(m)$, m=1, 2, . . . M of the reception calibration signal may be generated according to a working bandwidth BW of the system.

A transformation relation between the time domain sequence and the frequency domain sequence of the reception calibration signal is:

$$S_{RX}(k)=F[s_{RX}(m)], k,m=1,2,\ldots M \qquad (6)$$

$$s_{RX}(m)=F^{-1}[S_{RX}(k)], k,m=1,2,\ldots M \qquad (7)$$

Where $F[\bullet]$ represents fast fourier transform, and $F^{-1}[\bullet]$ represents inverse fast fourier transform.

In order to realize simplicity and convenience of operation of the fast fourier transform for the time domain and the frequency domain in the process of realizing calibration, the length of the time domain sequence of the calibration signal may be set to be $M=2^{floor[log_2 K]+1}$. Due to K<M, the frequency domain sequence $S_{RX}(k)$ of the reception calibration signal needs to be zero-padded to a length M.

As shown in the FIG. 3, the flow may include the following.

S301. The active antenna array receives a reception calibration signal transmitted by a test antenna from a reference beam direction, obtains an amplitude and phase error of each reception channel in the active antenna array, and updates a reception channel beam weight matrix according to the amplitude and phase error of each reception channel.

The reference beam direction may correspond to a direction angle ($\theta_q=0°$, $\varphi_q=0°$), and the direction angle ($\theta_q=0°$, $\varphi_q=0°$) represents an azimuth angle $\varphi_q=0°$ and a pitching angle $\theta_q=0°$. The embodiment of the present disclosure is described by taking the reference beam direction corresponding to the azimuth angle $\varphi_q=0°$ and the pitching angle $\theta_q=0°$ as an example.

In this step, a time domain sequence $s_{RX}(m)$, m=1, 2, . . . M of the reception calibration signal is transmitted at a rated power $P_{RX0}$ by means of a test antenna placed at a position with the azimuth angle $\varphi_q=0°$ and the pitching angle $\theta_q=0°$. Reception channels of the active antenna array receive N pieces of baseband data, and the N pieces of baseband data may be expressed by a received signal matrix $x(t)=[x_1(t), x_2(t), \ldots x_N(t)]^T$. Where N is the number of the reception channels of the active antenna array, and $x_n(t)$ in the received signal matrix x (t) represents the baseband data received by the nth reception channel.

Theoretically, after the time domain is synchronized, the amplitudes and the phases between the data (i.e., the above-mentioned N pieces of data) received by the respective reception channels in the active antenna array shall be completely consistent. However, since amplitude and phase errors between the reception channels cause the data actually received by the reception channels to be different, a difference value is a reception channel amplitude and phase error corresponding to the reference beam direction.

Based on above, according to the data received by the reception channels, the active antenna array determines an amplitude and phase difference matrix between the reception channels as:

$$h_{RX}=[h_1,h_2,\ldots h_N]^T \qquad (8)$$

Where a amplitude and phase difference $h_n$ may be obtained through the following method:

$$h_n = \frac{E\{s(t)x_n^*(t)\}}{E\{x_n(t)x_n^*(t)\}} \qquad (9)$$

Where $E\{\bullet\}$ represents a mathematical expectation operation, and $[\bullet]^*$ represents conjugate calculation.

According to the reception channel amplitude and phase error matrix $h_{RX}$ corresponding to the reference beam direction (the azimuth angle $\varphi_q=0°$ and the pitching angle $\theta_q=0°$), the active antenna array performs multi-channel amplitude and phase error compensation on the reception channel beam weight matrix to obtain an updated reception channel beam weight matrix:

$$W_{RX}=[\tilde{w}_{RX}(\theta_1,\varphi_1),\tilde{w}_{RX}(\theta_2,\varphi_2),\ldots,\tilde{w}_{RX}(\theta_Q,\varphi_Q)] \qquad (10)$$

$$\tilde{w}_{RX}(\theta_q,\varphi_q)=h_{RX}\otimes w(\theta_q,\varphi_q) \qquad (11)$$

Where $\otimes$ represents a point multiplication operation of respective elements in a vector.

S302: The active antenna array performs, according to the updated reception channel beam weight matrix, beamforming on the reception calibration signal of the reference beam direction to obtain a reception channel beam gain corresponding to the reference beam direction.

In this step, the active antenna array may determine the reception channel beam gain according to the following formula:

$$G_{RX0} = 10\log10\left(\frac{E\{|\tilde{w}_{RX}^H(0°, 0°)x(t)|^2\}}{P_{RX0}}\right) \qquad (12)$$

Where $G_{RX0}$ represents the reception channel beam gain corresponding to the reference beam direction (the azimuth angle $\varphi_q=0°$ and the pitching angle $\theta_q=0°$), and $\tilde{w}_{RX}^H(0°,0°)$ represents a beam weight vector having a direction angle of ($\theta_q=0°$, $\varphi_q=0°$) in the updated reception channel beam weight matrix.

S303: The active antenna array receives a reception calibration signal transmitted by a test antenna in a first beam direction region, and uses, according to a direction angle of the reception calibration signal from the first beam direction region, a beam weight vector corresponding to the direction angle in the reception channel beam weight matrix to perform beamforming on the reception calibration signal from the first beam direction region to obtain a reception channel beam gain corresponding to the first beam direction region.

The "first beam direction region" may be any beam region in L beam regions obtained by division. The direction angle corresponding to the first beam direction region is different from a direction angle corresponding to the reference beam direction.

In this step, the lth beam region is taken as an example. If the direction angle of the reception calibration signal transmitted by the test antenna is $(\theta_l,\varphi_l)$, the reception channel beam gain corresponding to the lth beam region is:

$$G_{RXl} = 10\log10\left(\frac{E\{|\tilde{w}_{RX}^H(\theta_l,\varphi_l)x(t)|^2\}}{P_{RX0}}\right) \quad (13)$$

Where $G_{RXl}$ represents the reception channel beam gain corresponding to the lth beam region; and $\tilde{w}_{RX}^H(\theta_l,\varphi_l)$ represents the beam weight vector corresponding to the direction angle $(\theta_l,\varphi_l)$ in the reception channel weight matrix.

Taking FIG. 2 as an example, in case of l=1, the test antenna 1 transmits a reception calibration signal, and the direction angle of the reception calibration signal is $(\theta_q=0°, \varphi_q=5°)$. The active antenna array performs, according to the beam weight vector corresponding to the direction angle $(\theta_q=0°,\varphi_q=5°)$ in the reception channel beam weight matrix, received beamforming on the reception calibration signal transmitted by the test antenna 1, and performs calculation to obtain the reception channel beam gain corresponding to the beam direction region 1.

S304: The active antenna array determines a difference value between the reception channel beam gain corresponding to the first beam direction region and the reception channel beam gain corresponding to the reference beam direction, and proceeds to S306 if the difference value is greater than a set gain error threshold, otherwise, proceeds to S305.

The gain error threshold may be preset. The value of the gain error threshold may be determined according to a requirement for the calibration accuracy. If the calibration accuracy is higher, the gain error threshold is smaller.

S305: The active antenna array determines that the calibration for the beam weight vector corresponding to the first beam direction region in the reception channel beam weight matrix is completed.

If the difference value between the reception channel beam gain corresponding to the first beam region and the reception channel beam gain corresponding to the reference beam direction is less than the set gain error threshold at S304, it is indicated that a reception channel error of the active antenna array is relatively small in all received beam directions corresponding to the first beam direction region, so that the reception beam weight vector corresponding to the first beam direction region in the reception channel beam weight matrix may be kept unchanged, that is, there is no need to perform error calibration for the reception channels in the received beam directions corresponding to the first beam direction region.

S306: The active antenna array performs at most K reception channel calibration iteration processes, so as to update the beam weight vector, corresponding to the direction angle of the reception calibration signal that is from the first beam direction region, in the reception channel beam weight matrix, thereby realizing calibration for the reception channels of the active antenna array in the received beam directions corresponding to the first beam direction region.

Figure 4:
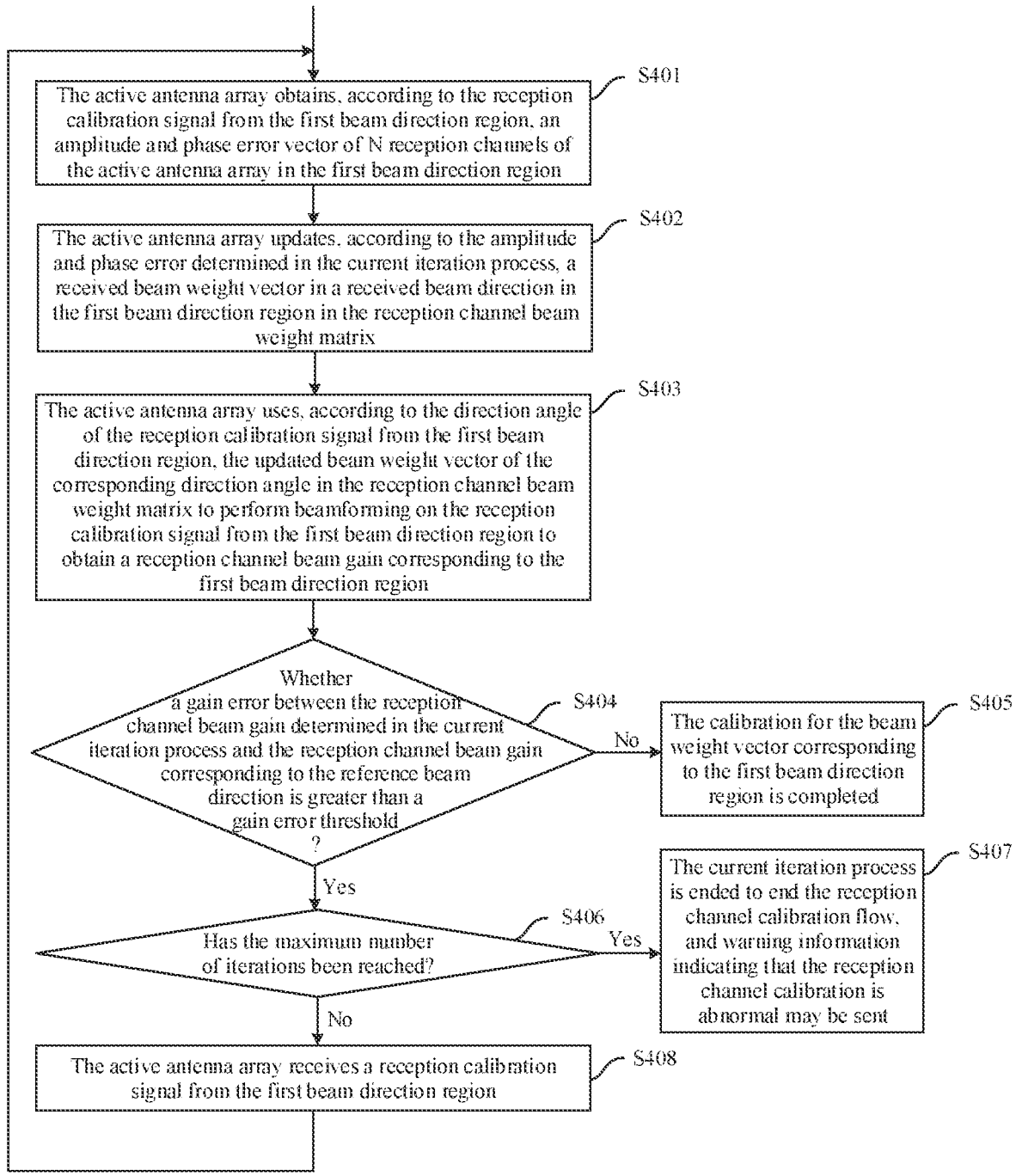
FIG. 4 is a flow diagram of a reception channel calibration iteration process in a reception channel calibration flow according to the embodiment of the present disclosure.

The reception channel calibration iteration process may refer to FIG. 4.

For each beam direction region, the reception channels of the active antenna array may be all calibrated according to S303 to S306 in the foregoing flow thereby realizing the calibration for the reception channels of the active antenna array in all the received beam directions.

Referring to FIG. 4, it is a flow diagram of a reception channel calibration iteration process according to the embodiment of the present disclosure. As shown in the figure, the flow may include the following.

S401: The active antenna array obtains, according to the reception calibration signal from the first beam direction region, an amplitude and phase error vector of N reception channels of the active antenna array in the first beam direction region.

The lth beam direction region is taken as an example. The amplitude and phase error vector of the N reception channels of the active antenna array in the lth beam direction region is:

$$h_{RX1}=[h_1^l, h_1^l, \ldots h_N^l]^T \quad (14)$$

$$h_n^l = \frac{E\{s(t)x_n^*(t)\}}{E\{x_n(t)x_n^*(t)\}}, n = 1, 2, \ldots, N-1 \quad (15)$$

S402: The active antenna array updates, according to the amplitude and phase error determined in the current iteration process, a received beam weight vector in a received beam direction in the first beam direction region in the reception channel beam weight matrix.

The lth beam direction region is taken as an example. The direction angle of the reception calibration signal of the test antenna from the lth beam direction region is $(\theta_l, \varphi_l)$. The lth beam direction region corresponds to all received beam directions in the following direction angle range: the azimuth angle range is $$\left[\varphi_l - \frac{P}{2}, \varphi_l + \frac{P}{2}\right],$$

and the pitching angle range is $$\left[\theta_l - \frac{P}{2}, \theta_l + \frac{P}{2}\right],$$

where P is the step size. The active antenna array updates, according to the amplitude and phase error vector determined in the current iteration process, the beam weight vectors of all the received beams in the direction angle range in the reception beam weight matrix.

If the received beam direction corresponding to the azimuth angle range $$\left[\varphi_l - \frac{P}{2}, \varphi_l + \frac{P}{2}\right]$$

and the pitching angle range $$\left[\theta_l - \frac{P}{2}, \theta_l + \frac{P}{2}\right]$$

is expressed as beam$_l^i$, the beam weight vector of beam$_l$ is expressed as w$(\theta_l^i,\varphi_l^i)$. Where i=1, 2, ..., R, and R is the number of the received beam directions in the above direction angle range. The beam weight vector of each received beam direction in the direction angle range is updated according to the following formula:

$$\tilde{w}_{RX}(\theta_1^i, \varphi_1^i) = h_{RX1} \otimes w(\theta_1^i, \varphi_1^i) \quad (16)$$

S403: The active antenna array uses, according to the direction angle of the reception calibration signal from the first beam direction region, the updated beam weight vector of the corresponding direction angle in the reception channel beam weight matrix to perform beamforming on the reception calibration signal from the first beam direction region to obtain a reception channel beam gain corresponding to the first beam direction region.

S404: The active antenna array determines whether a gain error between the reception channel beam gain determined in the current iteration process and the reception channel beam gain corresponding to the reference beam direction is greater than a gain error threshold, and proceeds to S406 if the gain error is greater than the gain error threshold, otherwise, S405 is executed.

S405: The current iteration process is ended, and the calibration for the beam weight vector corresponding to the first beam direction region is completed.

S406: It is determined whether the maximum number of iterations has been reached; S407 is executed if the maximum number of iterations has been reached, otherwise, S408 is executed.

S407. The current iteration process is ended to further end the reception channel calibration flow, and warning information indicating that the reception channel calibration is abnormal may be sent.

S408: The active antenna array receives a reception calibration signal from the first beam direction region, and S401 is executed to perform the next iteration process.

A scenario shown in FIG. 2 is taken as an example. In the process of calibrating the reception channels of the active antenna array, a reception calibration signal is transmitted through the test antenna 0 at first, and the direction angle of the signal is ($\theta_q=0°$, $\varphi_q=0°$). The active antenna array updates, according to S301 to S302 in FIG. 3, each beam weight vector in the reception channel beam weight matrix, and then uses the reception calibration signal with the direction angle of ($\theta_q=0°$, $\varphi_q=0°$) to perform initial calibration on the reception channels.

Later, the reception calibration signal is transmitted through the test antenna 1, and the direction angle of this signal is ($\theta_q=0°$, $\varphi_q=5°$). The active antenna array determines, according to S303 to S304 in FIG. 3, whether to update the several beam weight vectors within the direction angle range of $(\theta,\varphi) \in [\theta_l-2.5°, \theta_l+2.5°] \cap [\varphi_l-2.5°, \varphi_l+2.5°]$ corresponding to this direction angle; and executes, according to the flow shown in FIG. 4, a reception channel calibration iteration process if updating is needed until the several beam weight vectors in the direction angle range of $(\theta,\varphi) \in [\theta_l-2.5°, \theta_l+2.5°] \cap [\varphi_l-2.5°, \varphi_l+2.5°]$ are completely updated, or until the updating fails. If updating is not needed, the several beam weight vectors in the direction angle range of $(\theta,\varphi) \in [\theta_l-2.5°, \theta_l+2.5°] \cap [\varphi_l-2.5°, \varphi_l+2.5°]$ are kept unchanged.

Hereafter, for other beam direction regions, reception calibration signals are transmitted in sequence through the corresponding test antennas; and the reception calibration signal transmitted by each test antenna is processed according to the processing flow of reception channel calibration for the calibration signal transmitted by the test antenna 1 until the reception channel calibration is completed for all the beam direction regions.

It can been seen through the embodiments of the above reception channel calibration that: at first, the reception calibration signal in the reference beam direction is used to initially update the reception channel beam weight matrix, that is, to initially calibrate the reception channels; then, the beam weight vectors in a plurality of beam directions in a corresponding beam direction region range are updated respectively for different beam direction regions, so as to regionally update the beam weight vectors corresponding to the corresponding regions in the reception channel beam weight matrix, that is, to regionally calibrate the reception channels.

By adopting the method for calibrating the reception channel according to the above embodiments of the present disclosure, the beamforming functions of related devices of a large-scale active antenna array can be calibrated and detected under a production environment. Compared with the prior art, the method for calibrating the reception channel mainly has the following several advantages.

(1) The method for calibrating the reception channel according to the embodiments of the present disclosure does not need to be carried out in an anechoic chamber, so that the requirement standard and a heavy investment for a test site are lowered.

(2) The method for calibrating the reception channel according to the embodiments of the present disclosure performs limited detection in vertical and horizontal spatial dimensions only, so that the production detection efficiency is improved.

(3) The method for calibrating the reception channel according to the embodiments of the present disclosure is independent of a transmission channel calibration process, and can compensate an amplitude-phase error between a transmission channel and a reception channel and improve the beamforming functionality.

(4) The method for calibrating the reception channel according to the embodiments of the present disclosure is convenient for algorithm realization, and is favorable for being used in an actual production environment.

The embodiments of the present disclosure also provide a method for calibrating transmission channels for an active antenna array.

A transmission channel calibration process and the reception channel calibration process of the active antenna array may use the same calibration environment. A building method for the calibration environment may refer to the foregoing embodiment, and no more repeated descriptions will be provided here.

A transmission channel beam weight matrix W of the active antenna array includes beam weight vectors corresponding to a plurality of transmitted beam directions (i.e., a plurality of direction angles). Where the beam weight vector of one transmitted beam direction includes beam weights of N transmission channels corresponding to the one transmitted beam direction. N is the number of the transmission channels of the active antenna array, and N is an integer greater than 1.

Supposing that the transmission channel beam weight matrix W includes beam weight vectors corresponding to Q (Q is an integer greater than 1) transmitted beam directions (i.e., Q direction angles), a space range corresponding to the Q transmitted beam directions may be divided into L (L is an integer greater than 1, L<Q) beam direction regions according to the placement positions and the number of the test antennas. Each beam direction region corresponds to at least one beam direction, and at least one beam direction region in the L beam direction regions corresponds to a plurality of beam directions. The active antenna array may store a correspondence between each beam direction region and the transmitted beam directions.

Before calibration, the transmission channel beam weight matrix of the active antenna array is represented as $w_{TX}=w$. That is, before the calibration, the transmission channel beam weight matrix of the active antenna array is set to be the same as the initial beam weight matrix W.

Figure 5:
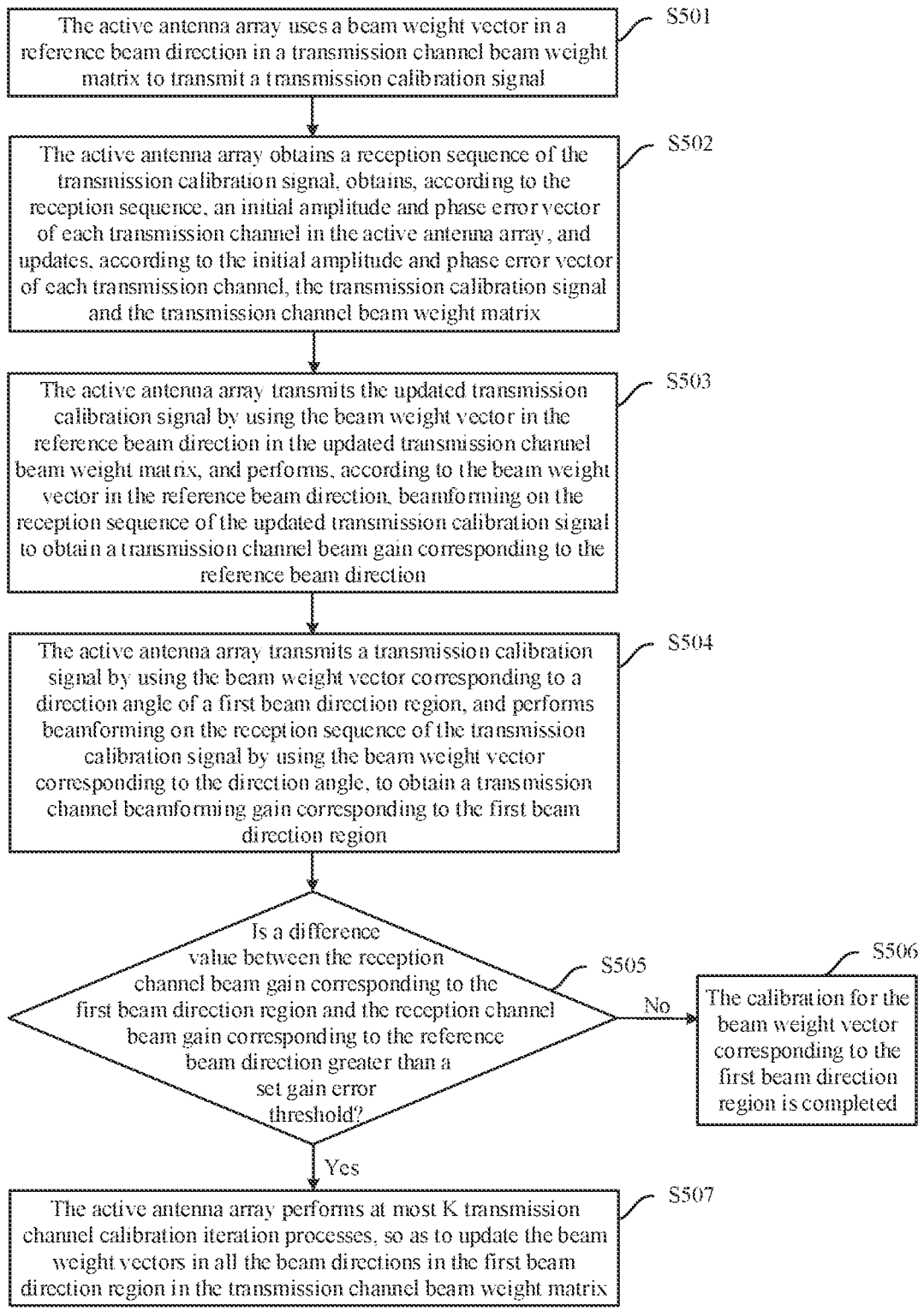
FIG. 5 is a schematic diagram of a transmission channel calibration flow according to the embodiment of the present disclosure.

Referring to FIG. 5, it is a schematic diagram of a transmission channel calibration flow for an active antenna array according to the embodiment of the present disclosure.

Before the transmission channels are calibrated, a sequence of a transmission calibration signal may be generated at first. The transmission calibration signal is transmitted by the active antenna array to a test antenna to calibrate the transmission channels of the active antenna array.

During specific implementation, a frequency domain sequence $S_n(k)$, k=1, 2, ... K', n=1, 2, ... N of the transmission calibration signal and a time domain sequence $s_n(m)$, m=1, 2, ... M, n=1, 2, ... N of the transmission calibration signal may be generated for each transmission channel according to a working bandwidth BW of the system, and N is the number of the transmission channels.

A transformation relation between the time domain sequence and the frequency domain sequence of the transmission calibration signal is:

$$S_n(k)=F[s_n(m)], k,m=1,2,\ldots M \qquad (17)$$

$$s_n(m)=F^{-1}[S_n(k)], k,m=1,2,\ldots M \qquad (18)$$

Where $F[\bullet]$ represents fast fourier transform, and $F^{-1}[\bullet]$ represents inverse fast fourier transform.

In order to realize simplicity and convenience of operation of the fast fourier transform for the time domain and the frequency domain in the process for realizing calibration, the length of the time domain sequence of the transmission calibration signal may be set to be $M=2^{floor[log_2 K]+1}$.

As shown in the FIG. 5, the flow may include the following.

S501: The active antenna array uses a beam weight vector in a reference beam direction in the transmission channel beam weight matrix to transmit a transmission calibration signal.

The reference beam direction may correspond to a direction angle ($\theta_q=0°$, $\varphi_q 0°$), and the direction angle ($\theta_q=0°$, $\varphi_q=0°$) represents an azimuth angle $\varphi_q=0°$ and a pitching angle $\theta_q=0°$. The embodiments of the present disclosure are described by taking the reference beam direction corresponding to an azimuth angle $\varphi_q=0°$ and a pitching angle $\theta_q=0°$ as an example.

In this step, the reference beam direction having the direction angle ($\theta_q=0°$, $\varphi_q=0°$) is taken as an example. Each transmission channel of the active antenna array uses a beam weight in the direction angle ($\theta_q=0°$, $\varphi_q=0°$) to transmit a time domain sequence $s_n(m)$, m=1, 2, ... M, n=1, 2, ... N of a transmission calibration sequence corresponding to the corresponding transmission channel at a rated nominal power $P_{TX0}$. The test antenna corresponding to the direction angle ($\theta_q=0°$, $\varphi_q=0°$) receives the transmission calibration signal, and the received signal is expressed as $x_{TX}(m)$, m=1, 2, ... M.

S502: The active antenna array obtains a reception sequence of the transmission calibration signal, obtains, according to the reception sequence, an initial amplitude and phase error vector of each transmission channel in the active antenna array, and updates, according to the initial amplitude and phase error vector of each transmission channel, the transmission calibration signal and the transmission channel beam weight matrix.

After synchronization and time-frequency domain transformation processing is performed on a signal received by the test antenna, a frequency domain calibration sequence $X_n(k)$, k=1, 2, ... K', n=1, 2, ... N corresponding to each transmission channel of the active antenna array is obtained, and the frequency domain calibration sequence used as a reception sequence is transmitted to the active antenna array. The process of performing the synchronization and time-frequency domain transformation processing and transmitting the processed frequency domain calibration sequence to the active antenna array may be executed by the test antenna, or executed by other devices. The embodiments of the present disclosure do not limit this.

The active antenna array determines, according to the reception sequence of the nth transmission channel, that an amplitude and phase error needing to be compensated of the nth transmission channel at a center frequency point $f_0$ is:

$$h_n(f_0) = \frac{[S(K'/2) + S(K'/2+1)]}{[X_n(K'/2) + X_n(K'/2+1)]} \qquad (19)$$

and determines, according to the amplitude and phase error needing to be compensated of each transmission channel at the center frequency point $f_0$, that an amplitude and phase error needing to be compensated of each transmission channel in the frequency domain is:

$$h_n(k) = \frac{S(k)}{h_n(f_0)X_n(k)}, k=1, 2, \ldots K' \qquad (20)$$

Since the length of the transmission calibration frequency domain sequence of each transmission channel is K, N-times linear interpolation fitting needs to be performed on $h_n(k)$, to obtain an amplitude and phase error calibration vector, needing to be compensated within a frequency domain bandwidth, of each transmission channel:

$$H_n(k), k=1,2, \ldots K, n=1,2, \ldots N \qquad (21)$$

The active antenna array may use the following formula to update, according to the amplitude and phase error of each transmission channel, the transmission calibration signal: a point multiplication operation is performed on the frequency domain sequence of the transmission calibration signal transmitted by each transmission channel and each element in the amplitude and phase error calibration vector $H_n$, needing to be compensated within a frequency domain bandwidth, of each transmission channel:

$$S_n^{AC}=h_n \otimes S_n \qquad (22)$$

An updated time domain sequence of each transmission channel is obtained through inverse fourier transform. The time domain sequence of the nth transmission channel is expressed as: $s_n^{AC}$, n=1, 2, ... N.

The active antenna array compensates for the channel amplitude and phase error at the center frequency point $f_0$ on the transmission channel beam weight matrix $W_{TX}$, that is, it is set:

$$W_{TX} = [\tilde{w}_{TX}(\theta_1, \varphi_1), \tilde{w}_{TX}(\theta_2, \varphi_2), \ldots, \tilde{w}_{TX}(\theta_Q, \varphi_Q)] \quad (23)$$

$$\tilde{w}_{TX}(\theta_q, \varphi_q) = h_{TX} \otimes w(\theta_q, \varphi_q) \quad (24)$$

$$h_{TX} = [h_1(f_0), h_2(f_0), \ldots, h_N(f_0)]^T \quad (25)$$

Where $W_{TX}$ is an updated transmission channel beam weight matrix after the amplitude and phase error is calibrated in the reference beam direction (such as a beam direction at $\theta_q = 0°$, $\varphi_q = 0°$), and $h_{TX}$ is an error vector, needing to be compensated at the center frequency point $f_0$, of the N transmission channels.

S503. The active antenna array transmits the updated transmission calibration signal by using the beam weight vector in the reference beam direction in the updated transmission channel beam weight matrix, and performs, according to the beam weight vector in the reference beam direction in the transmission channel beam weight matrix, beamforming on the reception sequence of the updated transmission calibration signal to obtain a transmission channel beam gain corresponding to the reference beam direction.

The direction angle $(\theta_q = 0°, \varphi_q = 0°)$ corresponding to the reference beam direction is taken as an example. The active antenna array transmits the updated transmission calibration signal at the rated nominal power $P_{TX0}$ by using the beam weight vector $\tilde{w}_{TX}(0°, 0°)$, and the time domain sequence of the transmission calibration signal of each transmission channel is $s_1^{AC}, s_2^{AC}, \ldots, s_N^{AC}$.

The time domain sequence of the signal received by the test antenna corresponding to the direction angle $(\theta_q = 0°, \varphi_q = 0°)$ is $x_{TX}^0(t)$. The time domain sequence used as a reception sequence of the transmission calibration signal is returned to the active antenna array. The active antenna array determines, according to the reception sequence of the transmission calibration signal, the transmission channel beam gain corresponding to the reference beam direction:

$$G_{TX0} = 10\log10\left(\frac{E\{|\tilde{w}_{TX}^H(0°, 0°)x_{TX}^0(t)|^2\}}{P_{TX0}}\right) \quad (26)$$

Where $G_{TX0}$ represents the transmission channel beam gain corresponding to the reference beam direction (the azimuth angle is $\varphi_q = 0°$ and the pitching angle is $\theta_q = 0°$), and $\tilde{w}_{TX}^H(0°, 0°)$ represents the beam weight vector with the direction angle $(\theta_q = 0°, \varphi_q = 0°)$ in the updated transmission channel beam weight matrix.

S504: The active antenna array transmits a transmission calibration signal by using the beam weight vector corresponding to a direction angle of a first beam direction region, and performs beamforming on the reception sequence of the transmission calibration signal by using the beam weight vector corresponding to the direction angle in the transmission channel beam weight matrix, to obtain a transmission channel beamforming gain corresponding to the first beam direction region.

The "first beam direction region" may be any beam region in L beam regions obtained by division. The direction angle corresponding to the first beam direction region is different from a direction angle corresponding to the reference beam direction.

In this step, the lth beam region is taken as an example. The active antenna array transmits the updated transmission calibration signal by using the beam weight vector $\tilde{w}_{TX}(\theta_l, \varphi_l)$ corresponding to the direction angle $(\theta_l, \varphi_l)$. The test antenna corresponding to the direction angle $(\theta_l, \varphi_l)$ receives the transmission calibration signal, and the time domain sequence of the transmission calibration signal received by the test antenna is $x_{TX}^l(t)$. The time domain sequence used as an end sequence of the transmission calibration signal is transmitted to the active antenna array.

The active antenna array performs beamforming on $x_{TX}^l(t)$ by using the beam weight vector $\tilde{w}_{TX}(\theta_l, \varphi_l)$ corresponding to the direction angle $(\theta_l, \varphi_l)$ according to the reception sequence $x_{TX}^l(t)$ of the transmission calibration signal, to obtain a reception channel beam gain corresponding to the lth beam region:

$$G_{TXl} = 10\log10\left(\frac{E\{|\tilde{w}_{TX}^H(\theta_l, \varphi_l)x_{TX}^l(t)|^2\}}{P_{TX0}}\right) \quad (27)$$

Where $G_{TX1}$ represents the transmission channel beam gain corresponding to the lth beam region; and $\tilde{w}_{TX}^H(\theta_l, \varphi_l)$ represents the beam weight vector in the direction angle $(\theta_l, \varphi_l)$ in the reception channel weight matrix.

Taking FIG. 2 as an example, in case of l=1, the active antenna array transmits the transmission calibration signal, and the direction angle of the transmission calibration signal is $(\theta_q = 0°, \varphi_q = 5°)$. The test antenna 1 receives the transmission calibration signal, and the time domain sequence of the transmission calibration signal received by the test antenna 1 is transmitted to the active antenna array. The active antenna array performs, according to the beam weight vector in the direction angle $(\theta_q = 0°, \varphi_q = 5°)$ in the reception channel beam weight matrix, received beamforming on the reception sequence of the transmission calibration signal, and performs calculation to obtain the reception channel beam gain corresponding to the beam direction region 1.

S505: The active antenna array determines a difference value between the transmission channel beam gain corresponding to the first beam direction region and the transmission channel beam gain corresponding to the reference beam direction, and proceeds to S506 if the difference value is less than or equal to a set gain error threshold, otherwise, proceeds to S507.

The gain error threshold may be preset. The value of the gain error threshold may be determined according to a requirement for the calibration accuracy. If the calibration accuracy is higher, the gain error threshold is smaller.

S506: The active antenna array determines that the calibration for the beam weight vector corresponding to the first beam direction region in the transmission channel beam weight matrix is completed.

If the difference value between the transmission channel beam gain corresponding to the first beam region and the transmission channel beam gain corresponding to the reference beam direction is less than the set gain error threshold at S505, it is indicated that a transmission channel error of the active antenna array in all transmitted beam directions corresponding to the first beam direction region is relatively small, so that all the beam weight vectors corresponding to the first beam direction region in the transmission channel beam weight matrix may be kept unchanged, that is, there is no need to perform error calibration for the reception channels in the beam directions corresponding to the first beam direction region.

S507: The active antenna array performs at most K transmission channel calibration iteration processes, so as to update the beam weight vectors in all beam directions in the first beam direction region in the transmission channel beam weight matrix, thereby realizing calibration for the transmission channels of the active antenna array in the beam directions corresponding to the first beam direction region.

Figure 6:
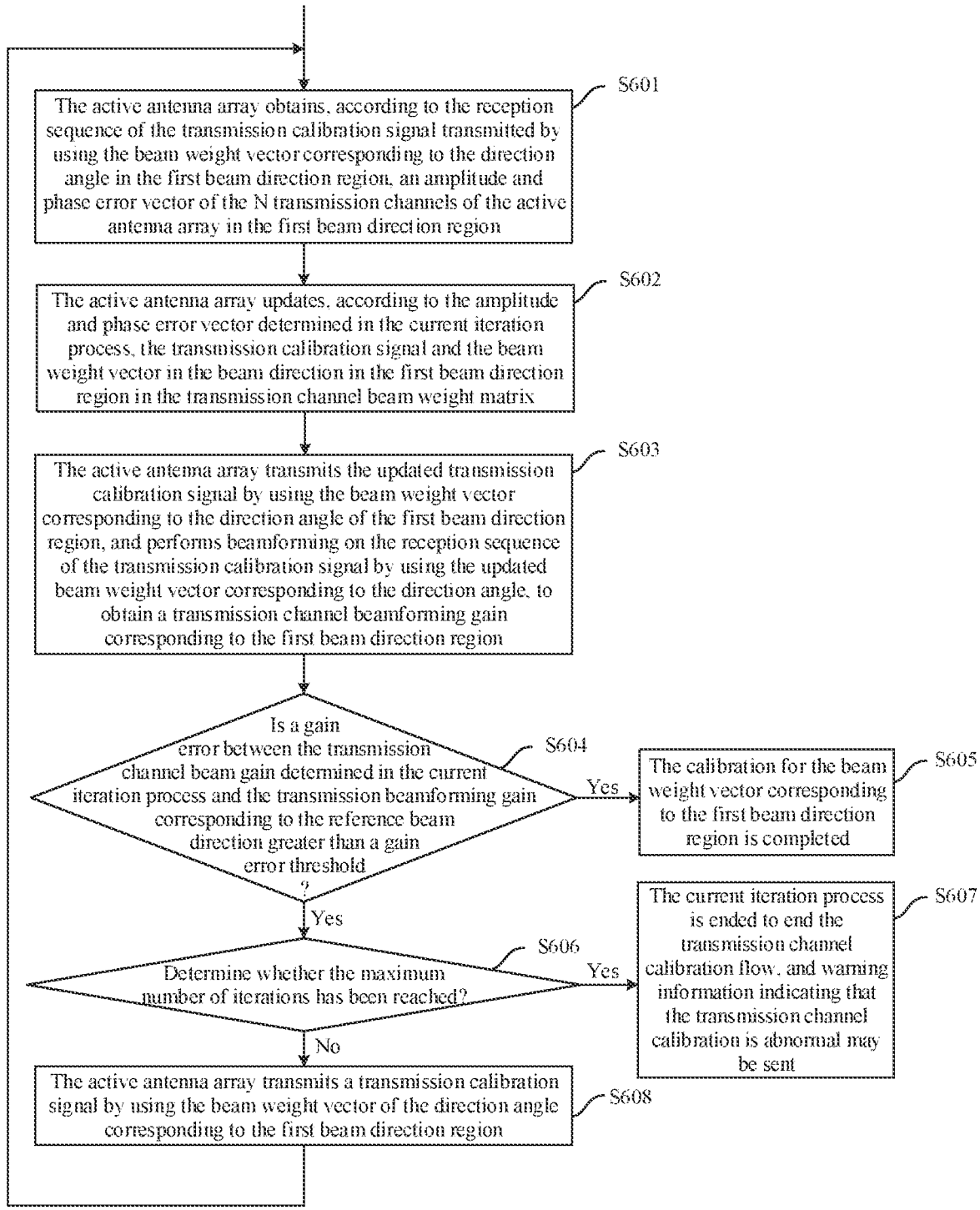
FIG. 6 is a flow diagram of a transmission channel calibration iteration process in a transmission channel calibration flow according to the embodiment of the present disclosure.

The transmission channel calibration iteration process may refer to FIG. 6.

For each beam direction region, the transmission channels of the active antenna array may be all calibrated according to S504 to S507 in the foregoing flow, thereby realizing the calibration for the transmission channels of the active antenna array in all the transmitted beam directions.

Referring to FIG. 6, it is a flow diagram of a transmission channel calibration iteration process according to the embodiment of the present disclosure. As shown in the figure, the flow may include the following.

S601: The active antenna array obtains, according to the reception sequence of the transmission calibration signal transmitted by using the beam weight vector corresponding to the direction angle in the first beam direction region, an amplitude and phase error vector of the N transmission channels of the active antenna array in the first beam direction region.

The lth beam direction region is taken as an example. The active antenna array determines, according to the reception sequence of the nth transmission channel, that an amplitude and phase error needing to be compensated of the nth transmission channel at a center frequency point $f_0$ corresponding to the direction angle $(\theta_l, \varphi_l)$ is:

$$h_{TX1} = [h_1^l(f_0), h_2^l(f_0), \ldots, h_N^l(f_0)]^T \quad (28)$$

and determines, according to the amplitude and phase error needing to be compensated of each transmission channel at the center frequency point $f_0$, corresponding to the direction angle $(\theta_l, \varphi_l)$, that an amplitude and phase error needing to be compensated of each transmission channel in the frequency domain is:

$$H_n^l(k), k=1,2,\ldots K, n=1,2,\ldots N \quad (29)$$

S602: The active antenna array updates, according to the amplitude and phase error vector determined in the current iteration process, the transmission calibration signal and the beam weight vector in the beam direction in the first beam direction region in the transmission channel beam weight matrix.

In this step, the active antenna array may update, according to the formula (22), the transmission calibration signal. The time domain sequence of the updated transmission calibration signal of each transmission channel is $s_1^{ACl}$, $s_2^{ACl}, \ldots, s_N^{ACl}$. Since the first beam direction region corresponds to the beam weight vectors in a plurality of beam directions in the transmission channel beam weight matrix, the active antenna array updates the beam weight vectors in all the beam directions corresponding to the first beam direction region.

The lth beam direction region is taken as an example, and the direction angle corresponding the lth beam direction region is $(\theta_l, \varphi_l)$. The beam direction region corresponds to all the beam directions in the following direction angle range: the azimuth angle range is $$\left[\varphi_l - \frac{P}{2}, \varphi_l + \frac{P}{2}\right],$$

and the pitching angle range is $$\left[\theta_l - \frac{P}{2}, \theta_l + \frac{P}{2}\right],$$

where P is the step size. The active antenna array updates, according to the amplitude and phase error vector determined in the current iteration process, the beam weight vectors in all the beam directions in the direction angle range in the transmission channel beam weight matrix.

If the beam direction corresponding to the azimuth angle range $$\left[\varphi_l - \frac{P}{2}, \varphi_l + \frac{P}{2}\right]$$

and the pitching angle range $$\left[\theta_l - \frac{P}{2}, \theta_l + \frac{P}{2}\right]$$

is expressed as $beam_l^i$, the beam weight vector of $beam_l^i$ is expressed as $w(\theta_l^i, \varphi_l^i)$. Where $i=1, 2, \ldots, R$, and R is the number of all the beam directions in the above direction angle range. The beam weight vector of each beam direction in the direction angle range is updated.

S603: The active antenna array transmits the updated transmission calibration signal by using the beam weight vector corresponding to the direction angle of the first beam direction region, and performs beamforming on the reception sequence of the transmission calibration signal by using the updated beam weight vector corresponding to the direction angle in the transmission channel beam weight matrix, to obtain a transmission channel beamforming gain corresponding to the first beam direction region.

S604: The active antenna array determines whether a gain error between the transmission channel beam gain determined in the current iteration process and a transmission beamforming gain corresponding to the reference beam direction is greater than a gain error threshold, and proceeds to S605 if the gain error is less than or equal to the gain error threshold, otherwise, proceeds to S606.

S605: The calibration for the beam weight vector corresponding to the first beam direction region is completed.

S606: It is determined whether the maximum number of iterations has been reached; and S607 is executed if the maximum number of iterations has been reached.

S607: The current iteration process is ended to further end the transmission channel calibration flow, and warning information indicating that the transmission channel calibration is abnormal may be sent.

S608: The active antenna array transmits a transmission calibration signal by using the beam weight vector of the direction angle corresponding to the first beam direction region, and obtains a reception sequence of the transmission calibration signal, and proceeds to S601 to enter the next iteration process.

A scenario shown in FIG. 2 is taken as an example. In the process of calibrating the transmission channels of the active antenna array, the active antenna array firstly transmits a transmission calibration signal by using the beam weight vector corresponding to the direction angle $(\theta_q=0°, \varphi_q=0°)$, updates, according to S501 to S502 in FIG. 5, each beam weight vector in the transmission channel beam weight matrix, and then initially calibrates the transmission channels by using the reception sequence of the transmission calibration signal with the direction angle ($\theta_q=0°$, $\varphi_q=0°$).

Later, the transmission calibration signal is transmitted through the test antenna 1, and the direction angle of this signal is ($\theta_q=0$, $\varphi_q=5°$). The active antenna array determines, according to S503 to S504 in FIG. 5, whether to update the several beam weight vectors within the direction angle range of $(\theta,\varphi) \in [\theta_I-2.5°, \theta_I+2.5°] \cap [\varphi_I-2.5°, \varphi_I+2.5°]$ corresponding to this direction angle, and executes, according to the flow shown in FIG. 6, a transmission channel calibration iteration process if updating is needed until the several beam weight vectors in the direction angle range of $(\theta,\varphi) \in [\theta_I-2.5°, \theta_I+2.5°] \cap [\varphi_I-2.5°, \varphi_I+2.5°]$ are completely updated, or until the updating fails. If updating is not needed, the several beam weight vectors in the direction angle range of $(\theta,\varphi) \in [\theta_I-2.5°, \theta_I+2.5°] \cap [\varphi_I-2.5°, \varphi_I+2.5°]$ are kept unchanged.

Hereafter, for other beam direction regions, the beam weight vectors corresponding to the direction angles of the corresponding beam direction regions are used to transmit transmission calibration signals in sequence; and according to the reception sequence of the transmission calibration signal, the transmission calibration signal is processed according to the transmission channel calibration flow for the beam direction region 1 in the above flow until the transmission channel calibration is completed for all the beam direction regions.

It can been seen through the embodiments of the above transmission channel calibration that: at first, the reception sequence of the transmission calibration signal in the reference beam direction is used to initially update the transmission channel beam weight matrix, that is, to initially calibrate the transmission channels; and then, the beam weight vectors in a plurality of beam directions in a corresponding beam direction region range are updated respectively for different beam direction regions, so as to regionally update the beam weight vectors corresponding to the corresponding regions in the transmission channel beam weight matrix, that is, to regionally calibrate the transmission channels.

By adopting the method for calibrating the transmission channel according to the above embodiments of the present disclosure, the beamforming functions of related devices of a large-scale active antenna array can be calibrated and detected under a production environment. Compared with the prior art, the method for calibrating the transmission channel mainly has the following several advantages.

(1) The method for calibrating the transmission channel according to the embodiments of the present disclosure does not need to be carried out in an anechoic chamber, so that the requirement standard and a heavy investment for a test site are lowered.

(2) The method for calibrating the transmission channel according to the embodiments of the present disclosure performs limited detection in vertical and horizontal spatial dimensions only, so that the production detection efficiency is improved.

(3) The method for calibrating the transmission channel according to the embodiments of the present disclosure is independent of a reception channel calibration process, and can compensate an amplitude-phase error between a transmission channel and a reception channel and improve the beamforming functionality.

(4) The method for calibrating the transmission channel according to the embodiments of the present disclosure is convenient for algorithm realization, and is favorable for being used in an actual production environment.

Based on the same technical concept, the embodiments of the present disclosure also provide an apparatus for calibrating an antenna used for calibrating reception channels of an active antenna array.

Figure 7:
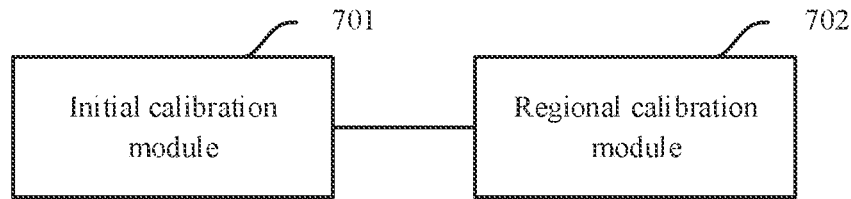
FIG. 7 is a schematic structural diagram of an apparatus for calibrating an antenna used for realizing reception channel calibration according to the embodiment of the present disclosure.

Referring to FIG. 7, it is a schematic structural diagram of an apparatus for calibrating an antenna used for realizing reception channel calibration according to the embodiment of the present disclosure. The apparatus is applied to an active antenna array. A received beam direction range corresponding to a reception channel beam weight matrix of the active antenna array is divided into a plurality of beam direction regions; and one beam direction region corresponds to at least one received beam direction, and at least one beam direction region corresponds to a plurality of received beam directions.

Optionally, both an azimuth angle and a pitching angle of the reference beam direction are zero.

Optionally, the direction angle of the reference beam direction is different from an azimuth angle corresponding to any beam direction region.

The apparatus may include: an initial calibration module 701 and a regional calibration module 702.

The initial calibration module 701 is configured to obtain, according to a reception calibration signal received by the active antenna array from the reference beam direction, an initial amplitude and phase error vector of N reception channels of the active antenna array in the reference beam direction, update, according to the initial amplitude and phase error vector, a beam weight vector in each beam direction in the reception channel beam weight matrix, and perform, according to the updated beam weight vector in the reference beam direction in the reception channel beam weight matrix, beamforming on the reception calibration signal in the reference beam direction to obtain a first reception channel beam gain corresponding to the reference beam direction, where the beam weight vector of one received beam direction includes beam weights of the N reception channels corresponding to the one received beam direction, and N is an integer greater than 1.

The regional calibration module 702 is configured to perform beamforming on a reception calibration signal in a first beam direction region by using a beam weight vector in a corresponding direction angle in the reception channel beam weight matrix according to the reception calibration signal received by the active antenna array from the first beam direction region and a direction angle corresponding to the first beam direction region, to obtain a second reception channel beam gain corresponding to the first beam direction region; and if a gain error between the second reception channel beam gain and the first reception channel beam gain is greater than a gain error threshold, perform at most K reception channel calibration iteration processes according to the reception calibration signal from the first beam direction region, where K is the maximum number of iterations, and the first beam direction region is one of the plurality of beam direction regions.

Optionally, in each iteration process in the at most K reception channel calibration iteration processes, the regional calibration module 702 executes:

obtaining, according to the reception calibration signal from the first beam direction region, an amplitude and phase error vector of the N reception channels of the active antenna array in the first beam direction region;

updating the beam weight vector in the beam direction in the first beam direction region in the reception channel beam weight matrix according to the amplitude and phase error vector determined in a current iteration process;

performing beamforming on the reception calibration signal from the first beam direction region by using the updated beam weight vector in the corresponding direction angle in the reception channel beam weight matrix according to the direction angle of the reception calibration signal from the first beam direction region, to obtain a reception channel beam gain corresponding to the first beam direction region;

determining whether a gain error between the reception channel beam gain determined in the current iteration process and the first reception channel beam gain is greater than the gain error threshold, if the gain error is greater than the gain error threshold, receiving the reception calibration signal from the first beam direction region in the case of not reaching the maximum number of iterations, and performing a next iteration process; otherwise, ending the current iteration process.

Based on the same technical concept, the embodiments of the present disclosure also provide an antenna calibration apparatus used for calibrating transmission channels of an active antenna array.

Figure 8:
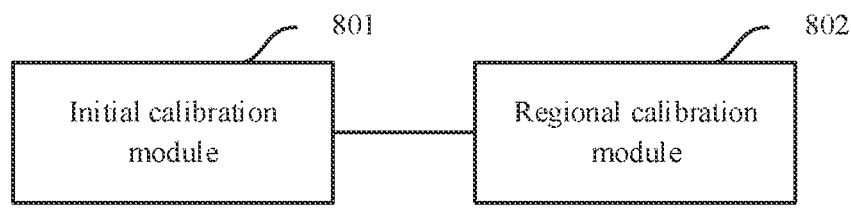
FIG. 8 is a schematic structural diagram of an apparatus for calibrating an antenna used for realizing transmission channel calibration according to the embodiment of the present disclosure.

Referring to FIG. 8, it is a schematic structural diagram of an apparatus for calibrating an antenna used for realizing transmission channel calibration according to the embodiment of the present disclosure. The apparatus is applied to an active antenna array. A transmitted beam direction range corresponding to a transmission channel beam weight matrix of the active antenna array is divided into a plurality of beam direction regions; and one beam direction region corresponds to at least one transmitted beam direction, and at least one beam direction region corresponds to a plurality of transmitted beam directions.

Optionally, both an azimuth angle and a pitching angle of the reference beam direction are zero.

Optionally, the direction angle of the reference beam direction is different from an azimuth angle corresponding to any beam direction region.

The apparatus may include: an initial calibration module 801 and a regional calibration module 802.

The initial calibration module 801 is configured to: obtain an initial amplitude and phase error vector of N transmission channels of the active antenna array according to a reception sequence of a transmission calibration signal transmitted by the active antenna array by using a beam weight vector in a reference beam direction in the transmission channel beam weight matrix, update, according to the initial amplitude and phase error vector, the transmission calibration signal and the beam weight vector in each beam direction in the transmission channel beam weight matrix, transmit the updated transmission calibration signal by using the updated beam weight vector of the reference beam direction in the transmission channel beam weight matrix, and perform, according to the beam weight vector in the reference beam direction, beamforming on the reception sequence of the updated transmission calibration signal to obtain a first transmission channel beam gain corresponding to the reference beam direction, where a beam weight vector of one transmitted beam direction includes beam weights of the N transmission channels corresponding to the one transmitted beam direction, and N is an integer greater than 1.

The regional calibration module 802 is configured to: after the active antenna array transmits a transmission calibration signal by using a beam weight vector corresponding to a direction angle of a first beam direction region, perform beamforming on a reception sequence of the transmitted transmission calibration signal by using the beam weight vector of the corresponding direction angle in the transmission channel beam weight matrix to obtain a second transmission channel beam gain corresponding to the first beam direction region; and if a gain error between the second transmission channel beam gain and the first transmission channel beam gain is greater than a gain error threshold, perform at most K transmission channel calibration iteration processes, where K is the maximum number of iterations, and the first beam direction region is one of the plurality of beam direction regions.

Optionally, in each iteration process in the at most K reception channel calibration iteration processes, the regional calibration module 802 executes:

obtaining, according to the reception sequence of the transmission calibration signal transmitted by using the beam weight vector corresponding to the direction angle of the first beam direction region, an amplitude and phase error vector of the N transmission channels of the active antenna array in the first beam direction region;

updating the transmission calibration signal and the beam weight vector of the beam direction in the first beam direction region in the transmission channel beam weight matrix according to the amplitude and phase error vector determined in a current iteration process;

transmitting the updated transmission calibration signal by using the beam weight vector corresponding to the direction angle in the first beam direction region;

performing beamforming on the reception sequence of the transmission calibration signal by using the beam weight vector corresponding to the direction angle, to obtain a transmission channel beam gain corresponding to the first beam direction region;

determining whether a gain error between the transmission channel beam gain determined in the current iteration process and the first transmission channel beam gain is greater than the gain error threshold; if the gain error is greater than the gain error threshold, transmitting the transmission calibration signal by using the beam weight vector of the direction angle corresponding to the first beam direction region in the case of not reaching the maximum number of iterations, and performing a next iteration process; otherwise, ending the current iteration process.

Based on the same technical concept, the embodiments of the present disclosure also provide a communication apparatus. The communication apparatus can realize the reception channel calibration flow in the foregoing embodiment.

Figure 9:
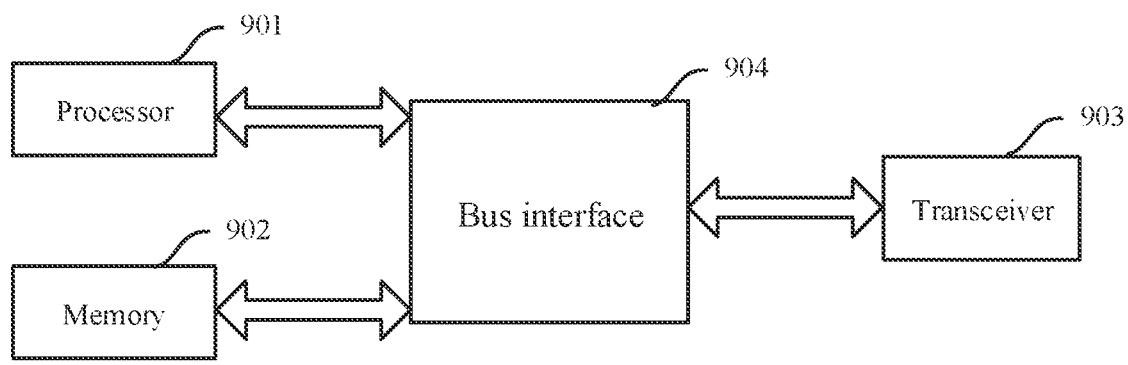
FIG. 9 is a schematic structural diagram of a communication apparatus according to the embodiments of the present disclosure.

Referring to FIG. 9, it is a schematic structural diagram of a communication apparatus according to the embodiments of the present disclosure. As shown in figure, the communication apparatus may include: a processor 901, a memory 902, a transceiver 903 and a bus interface 904.

The processor 901 is responsible for managing the bus architecture and performing usual processing, and the memory 902 may store data used when the processor 901 performs operations. The transceiver 903 is configured to receive and transmit data under the control of the processor 901.

A bus architecture may include any number of interconnected buses and bridges, and is particularly formed by linking one or more of processors represented by the processor 901 and the various circuits of memories represented by the memory 902 together. The bus architecture may also link various other circuits such as peripherals, voltage regulators and power management circuits, which are well known in the art and, therefore, will not be further described herein. A bus interface 904 provides an interface. The processor 901 is responsible for managing the bus architecture and performing usual processing, and the memory 902 may store data used when the processor 901 performs operations.

A flow disclosed by the embodiment of the present disclosure may be applied to the processor 901, or implemented by the processor 901. In the implementation process, each step of a signal processing flow may be completed by integrated logic circuits of hardware in the processor 901 or instructions in the form of software. The processor 901 may be a general-purpose processor, a digital signal processor, an application specific integrated circuit, a field programmable gate array or other programmable logic device, a discrete gate or transistor logic device, and a discrete hardware component, and may implement or execute the various methods, steps and logic block diagrams disclosed in the embodiments of the present disclosure. The general-purpose processor may be a microprocessor or any conventional processor. The steps of the method disclosed in conjunction with the embodiment of the present disclosure may be directly embodied as being executed by a hardware processor, or may be executed and completed by a combination of hardware and software modules in the processor. The software module may be located in a mature storage medium in the art, such as a random access memory, a flash memory, a read-only memory, a programmable read-only memory, an electrically erasable programmable memory, and a register. The storage medium is located in the memory 902, and the processor 901 reads information in the memory 902 and completes the steps of the signal processing flow in combination with its hardware.

Specifically, the processor 901 is used for reading programs in the memory 902 to execute the reception channel calibration flow described in the foregoing embodiments. The specific implementation of the flow may refer to the related descriptions of the foregoing embodiments, and no more repeated descriptions will be provided here.

Based on the same technical concept, the embodiments of the present disclosure also provide a communication apparatus. The communication apparatus can realize the transmission channel calibration flow in the foregoing embodiment.

Figure 10:
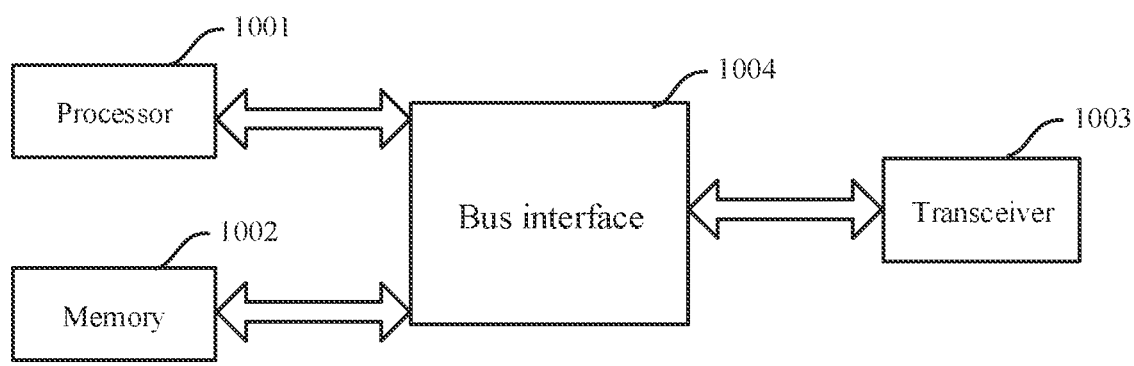
FIG. 10 is a schematic structural diagram of a communication apparatus according to other embodiments of the present disclosure.

Referring to FIG. 10, it is a schematic structural diagram of a communication apparatus according to the embodiments of the present disclosure. As shown in figure, the communication apparatus may include: a processor 1001, a memory 1002, a transceiver 1003 and a bus interface 1004.

The processor 1001 is responsible for managing the bus architecture and performing usual processing, and the memory 1002 may store data used when the processor 1001 performs operations. The transceiver 1003 is configured to receive and transmit data under the control of the processor 1001.

A bus architecture may include any number of interconnected buses and bridges, and is particularly formed by linking one or more of processors represented by the processor 1001 and the various circuits of memories represented by the memory 1002 together. The bus architecture may also link various other circuits such as peripherals, voltage regulators and power management circuits, which are well known in the art and, therefore, will not be further described herein. A bus interface 1004 provides an interface. The processor 1001 is responsible for managing the bus architecture and performing usual processing, and the memory 1002 may store data used when the processor 1001 performs operations.

A flow disclosed by the embodiment of the present disclosure may be applied to the processor 1001, or implemented by the processor 1001. In the implementation process, each step of a signal processing flow may be completed by integrated logic circuits of hardware in the processor 1001 or instructions in the form of software. The processor 1001 may be a general-purpose processor, a digital signal processor, an application specific integrated circuit, a field programmable gate array or other programmable logic device, a discrete gate or transistor logic device, and a discrete hardware component, and may implement or execute the various methods, steps and logic block diagrams disclosed in the embodiments of the present disclosure. The general-purpose processor may be a microprocessor or any conventional processor. The steps of the method disclosed in conjunction with the embodiment of the present disclosure may be directly embodied as being executed by a hardware processor, or may be executed and completed by a combination of hardware and software modules in the processor. The software module may be located in a mature storage medium in the art, such as a random access memory, a flash memory, a read-only memory, a programmable read-only memory, an electrically erasable programmable memory, and a register. The storage medium is located in the memory 1002, and the processor 1001 reads information in the memory 1002 and completes the steps of the signal processing flow in combination with its hardware.

Specifically, the processor 1001 is used for reading programs in the memory 1002 to execute the transmission channel calibration flow described in the foregoing embodiments. The specific implementation of the flow may refer to the related descriptions of the foregoing embodiments, and no more repeated descriptions will be provided here.

Based on the same technical concept, the embodiments of the present disclosure further provide a computer-readable storage medium. The computer-readable storage medium stores computer-executable instructions. The computer-executable instructions are configured to cause a computer to execute the flows executed in the foregoing embodiments.

The present disclosure is described by referring to flowcharts and/or block diagrams of methods, devices (systems) and computer program products according to the embodiments of the present application. It should be understood that computer program instructions may implement each flow and/or each block in the flowcharts and/or the block diagrams and combination of the flows and/or the blocks in the flow diagrams and/or the block diagrams. These computer program instructions may be provided for a general computer, a dedicated computer, an embedded processor or processing units of other programmable data processing devices to generate a machine, thereby making the instructions that are executed by the computer or the processing units of other programmable data processing devices generate apparatuses for realizing specified functions in one or multiple flows of the flow diagrams and/or one or multiple blocks of the block diagrams.

These computer program instructions may also be stored in a computer readable memory capable of guiding the computer or other programmable data processing devices to work in a specific manner, thereby making the instructions that are stored in the computer readable memory generate manufactured products that include instruction apparatuses. The instruction apparatuses realize the specified functions in one or multiple flows of the flow diagrams and/or one or multiple blocks of the block diagrams.

These computer program instructions also may be loaded onto the computer or other programmable data processing devices to execute a series of operation steps on the computer or other programmable data processing devices to generate computer implemented processing, so that the instructions executed on the computer or other programmable data processing devices provide steps for realizing the specified functions in one or multiple flows of the flow diagrams and/or one or multiple blocks of the block diagrams.

Although the preferred embodiments of the present disclosure have been described, those skilled in the art can make other changes and modifications to these embodiments once they acquire the basic creative concept. Therefore, attached claims is intended to be explained as including the preferred embodiments and all the changes and modifications that fall within the scope of the present disclosure.

Apparently, those skilled in the art can make various changes and modifications to the present disclosure without departing from the spirit and scope of the present disclosure. Therefore, if these changes and modifications of the present disclosure fall within the scope of the claims of the present disclosure and equivalent technologies of the present disclosure, the present disclosure is intended to include these changes and modifications.

What is claimed is:

1. A method for calibrating an antenna, wherein a received beam direction range corresponding to a reception channel beam weight matrix of an active antenna array is divided into a plurality of beam direction regions; one beam direction region corresponds to at least one received beam direction, and a plurality of beam direction regions correspond to a plurality of received beam directions; and the method comprises:

receiving, by the active antenna array, a reception calibration signal from a reference beam direction, obtaining an initial amplitude and phase error vector of N reception channels of the active antenna array in the reference beam direction, updating, according to the initial amplitude and phase error vector, a beam weight vector in each beam direction in the reception channel beam weight matrix, and performing, according to the updated beam weight vector in the reference beam direction in the reception channel beam weight matrix, beamforming on the reception calibration signal in the reference beam direction, for obtaining a first reception channel beam gain corresponding to the reference beam direction, wherein a beam weight vector of one received beam direction comprises beam weights of the N reception channels corresponding to the one received beam direction, and N is an integer greater than 1;

receiving, by the active antenna array, a reception calibration signal from a first beam direction region, and performing beamforming on the reception calibration signal in the first beam direction region by using a beam weight vector of a corresponding direction angle in the reception channel beam weight matrix according to a direction angle corresponding to the first beam direction region, for obtaining a second reception channel beam gain corresponding to the first beam direction region; and if a gain error between the second reception channel beam gain and the first reception channel beam gain is greater than a gain error threshold, performing at most K reception channel calibration iteration processes according to the reception calibration signal from the first beam direction region; wherein K is the maximum number of iterations, and the first beam direction region is one of the plurality of beam direction regions.

2. The method according to claim 1, wherein in each iteration process in the at most K reception channel calibration iteration processes, the active antenna array executes:

obtaining, according to the reception calibration signal from the first beam direction region, an amplitude and phase error vector of the N reception channels of the active antenna array in the first beam direction region;

updating the beam weight vector in the beam direction in the first beam direction region in the reception channel beam weight matrix according to the amplitude and phase error vector determined in a current iteration process;

performing beamforming on the reception calibration signal from the first beam direction region by using the updated beam weight vector in the corresponding direction angle in the reception channel beam weight matrix according to the direction angle of the reception calibration signal from the first beam direction region, for obtaining a reception channel beam gain corresponding to the first beam direction region; and determining whether a gain error between the reception channel beam gain determined in the current iteration process and the first reception channel beam gain is greater than the gain error threshold; if the gain error is greater than the gain error threshold, receiving the reception calibration signal from the first beam direction region in the case of not reaching the maximum number of iterations, and performing a next iteration process; otherwise, ending the current iteration process.

3. The method according to claim 1, wherein both an azimuth angle and a pitching angle of the reference beam direction are zero.

4. The method according to claim 1, wherein the direction angle of the reference beam direction is different from an azimuth angle of any beam direction region.

5. A non-transitory computer-readable storage medium, wherein the computer-readable storage medium stores computer-executable instructions; and the computer-executable instructions are configured to cause a computer to implement the method according to claim 1.

6. A method for calibrating an antenna, wherein a transmitted beam direction range corresponding to a transmission channel beam weight matrix of an active antenna array is divided into a plurality of beam direction regions; one beam direction region corresponds to at least one transmitted beam direction, and a plurality of beam direction regions corresponds to a plurality of transmitted beam directions; and the method comprises:

transmitting, by the active antenna array, a transmission calibration signal by using a beam weight vector in a reference beam direction in a transmission channel beam weight matrix; obtaining, according to a reception sequence of the transmission calibration signal, an initial amplitude and phase error vector of N transmission channels of the active antenna array; updating, according to the initial amplitude and phase error vector, the transmission calibration signal and a beam weight vector in each beam direction in the transmission channel beam weight matrix; transmitting the updated transmission calibration signal by using the updated beam weight vector of the reference beam direction in the transmission channel beam weight matrix; and performing, according to the beam weight vector in the reference beam direction, beamforming on the reception sequence of the updated transmission calibration signal for obtaining a first transmission channel beam gain corresponding to the reference beam direction; wherein a beam weight vector of one transmitted beam direction comprises beam weights of the N transmission channels corresponding to the one transmitted beam direction, and N is an integer greater than 1;

transmitting, by the active antenna array, a transmission calibration signal by using a beam weight vector corresponding to a direction angle of a first beam direction region, and performing beamforming on a reception sequence of the transmitted transmission calibration signal by using the beam weight vector of the corresponding direction angle in the transmission channel beam weight matrix, for obtaining a second transmission channel beam gain corresponding to the first beam direction region; and if a gain error between the second transmission channel beam gain and the first transmission channel beam gain is greater than a gain error threshold, performing at most K transmission channel calibration iteration processes; wherein K is the maximum number of iterations, and the first beam direction region is one of the plurality of beam direction regions.

7. The method according to claim 6, wherein in each iteration process in the at most K transmission channel calibration iteration processes, the active antenna array executes:

obtaining, according to the reception sequence of the transmission calibration signal transmitted by using the beam weight vector corresponding to the direction angle of the first beam direction region, an amplitude and phase error vector of the N transmission channels of the active antenna array in the first beam direction region;

updating the transmission calibration signal and the beam weight vector of the beam direction in the first beam direction region in the transmission channel beam weight matrix according to the amplitude and phase error vector determined in a current iteration process;

transmitting the updated transmission calibration signal by using the beam weight vector corresponding to the direction angle in the first beam direction region;

performing beamforming on the reception sequence of the transmission calibration signal by using the beam weight vector corresponding to the direction angle, for obtaining a transmission channel beam gain corresponding to the first beam direction region; and determining whether a gain error between the transmission channel beam gain determined in the current iteration process and the first transmission channel beam gain is greater than the gain error threshold; if the gain error is greater than the gain error threshold, transmitting the transmission calibration signal by using the beam weight vector of the direction angle corresponding to the first beam direction region in the case of not reaching the maximum number of iterations, and performing a next iteration process; otherwise, ending the current iteration process.

8. The method according to claim 6, wherein both an azimuth angle and a pitching angle of the reference beam direction are zero.

9. The method according to claim 6, wherein the direction angle of the reference beam direction is different from an azimuth angle of any beam direction region.

10. A communication apparatus, comprising: a processor, a memory and a transceiver, wherein the transceiver comprises a transmission channel and a reception channel; and the processor is configured to read a program in the memory and execute the method according to claim 6.

11. The apparatus according to claim 10, wherein in each iteration process in the at most K transmission channel calibration iteration processes, the processor executes:

obtaining, according to the reception sequence of the transmission calibration signal transmitted by using the beam weight vector corresponding to the direction angle of the first beam direction region, an amplitude and phase error vector of the N reception channels of the active antenna array in the first beam direction region;

updating the transmission calibration signal and the beam weight vector of the beam direction in the first beam direction region in the transmission channel beam weight matrix according to the amplitude and phase error vector determined in a current iteration process;

transmitting the updated transmission calibration signal by using the beam weight vector corresponding to the direction angle in the first beam direction region, performing beamforming on the reception sequence of the transmission calibration signal by using the beam weight vector corresponding to the direction angle, for obtaining a transmission channel beam gain corresponding to the first beam direction region; and determining whether a gain error between the transmission channel beam gain determined in the current iteration process and the first transmission channel beam gain is greater than the gain error threshold; if the gain error is greater than the gain error threshold, transmitting the transmission calibration signal by using the beam weight vector of the direction angle corresponding to the first beam direction region in the case of not reaching the maximum number of iterations, and performing a next iteration process; otherwise, ending the current iteration process.

12. The apparatus according to claim 10, wherein both an azimuth angle and a pitching angle of the reference beam direction are zero.

13. The apparatus according to claim 10, wherein the direction angle of the reference beam direction is different from an azimuth angle corresponding to any beam direction region.

14. A non-transitory computer-readable storage medium, wherein the computer-readable storage medium stores computer-executable instructions; and the computer-executable instructions are configured to cause a computer to implement the method according to claim 6.

15. A communication apparatus, comprising: a processor, a memory and a transceiver, wherein the transceiver comprises a transmission channel and a reception channel; a received beam direction range corresponding to a reception channel beam weight matrix is divided into a plurality of beam direction regions; one beam direction region corresponds to at least one received beam direction, and a plurality of beam direction regions correspond to a plurality of received beam directions;

the processor is configured to read a program in the memory and execute:

obtaining, according to a reception calibration signal received by an active antenna array from a reference beam direction, an initial amplitude and phase error vector of N reception channels of the active antenna array in the reference beam direction;

updating, according to the initial amplitude and phase error vector, a beam weight vector in each beam direction in the reception channel beam weight matrix;

performing, according to the updated beam weight vector in the reference beam direction in the reception channel beam weight matrix, beamforming on the reception calibration signal in the reference beam direction, for obtaining a first reception channel beam gain corresponding to the reference beam direction; wherein a beam weight vector of one received beam direction comprises beam weights of the N reception channels corresponding to the one received beam direction, and N is an integer greater than 1;

performing beamforming on a reception calibration signal in a first beam direction region by using a beam weight vector in a corresponding direction angle in the reception channel beam weight matrix according to the reception calibration signal received by the active antenna array from the first beam direction region and a direction angle corresponding to the first beam direction region, for obtaining a second reception channel beam gain corresponding to the first beam direction region; and if a gain error between the second reception channel beam gain and the first reception channel beam gain is greater than a gain error threshold, performing at most K reception channel calibration iteration processes according to the reception calibration signal from the first beam direction region; wherein K is the maximum number of iterations, and the first beam direction region is one of the plurality of beam direction regions.

16. The apparatus according to claim 15, wherein in each iteration process in the at most K reception channel calibration iteration processes, the processor executes:

obtaining, according to the reception calibration signal from the first beam direction region, an amplitude and phase error vector of the N reception channels of the active antenna array in the first beam direction region;

updating the beam weight vector in the beam direction in the first beam direction region in the reception channel beam weight matrix according to the amplitude and phase error vector determined in a current iteration process;

performing beamforming on the reception calibration signal from the first beam direction region by using the updated beam weight vector in the corresponding direction angle in the reception channel beam weight matrix according to the direction angle of the reception calibration signal from the first beam direction region, for obtaining a reception channel beam gain corresponding to the first beam direction region; and determining whether a gain error between the reception channel beam gain determined in the current iteration process and the first reception channel beam gain is greater than the gain error threshold; if the gain error is greater than the gain error threshold, receiving the reception calibration signal from the first beam direction region in the case of not reaching the maximum number of iterations, and performing a next iteration process; otherwise, ending the current iteration process.

17. The apparatus according to claim 15, wherein both an azimuth angle and a pitching angle of the reference beam direction are zero.

18. The apparatus according to claim 15, wherein the direction angle of the reference beam direction is different from an azimuth angle of any beam direction region.

* * * * *